(12) United States Patent
Kukal et al.

(10) Patent No.: US 9,454,634 B1
(45) Date of Patent: Sep. 27, 2016

(54) METHODS, SYSTEMS, AND COMPUTER PROGRAM PRODUCT FOR AN INTEGRATED CIRCUIT PACKAGE DESIGN ESTIMATOR

(71) Applicant: Cadence Design Systems, Inc., San Jose, CA (US)

(72) Inventors: Taranjit Singh Kukal, Delhi (IN); Surender Singh, Delhi (IN); Avinash Singh, Haryana (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/588,279

(22) Filed: Dec. 31, 2014

(51) Int. Cl.
*G06F 17/50* (2006.01)
(52) U.S. Cl.
CPC ....... *G06F 17/5077* (2013.01); *G06F 17/5072* (2013.01)
(58) Field of Classification Search
CPC .................................................. G06F 17/5077
USPC ....................................................... 716/127
See application file for complete search history.

(56) References Cited

U.S. PATENT DOCUMENTS

| | | | |
|---|---|---|---|
| 6,177,294 B1* | 1/2001 | Nakatake | 438/106 |
| 7,281,326 B1* | 10/2007 | Kwong et al. | 29/852 |
| 8,769,468 B1* | 7/2014 | Alpert et al. | 716/130 |
| 8,949,762 B1* | 2/2015 | Alpert et al. | 716/131 |
| 2004/0164431 A1* | 8/2004 | Seaman et al. | 257/786 |
| 2005/0183882 A1* | 8/2005 | Yun et al. | 174/250 |
| 2005/0278679 A1* | 12/2005 | Yaguchi et al. | 716/15 |
| 2006/0005153 A1* | 1/2006 | Maruyama et al. | 716/5 |
| 2006/0124968 A1* | 6/2006 | Watanuki et al. | 257/207 |
| 2008/0245556 A1* | 10/2008 | Bird et al. | 174/262 |
| 2009/0031273 A1* | 1/2009 | Tsai | 716/11 |

OTHER PUBLICATIONS

Olney, B. "Multilayer PCB Stackup Planning", 2011.

\* cited by examiner

*Primary Examiner* — Suchin Parihar
(74) *Attorney, Agent, or Firm* — Vista IP Law Group, LLP

(57) ABSTRACT

Disclosed are mechanisms for implementing an IC package layout design with an integrated circuit package design estimator. These mechanisms determine an estimated number of layers for an integrated circuit (IC) package design including one or more IC die designs, determine whether the estimated number of layers suffice to accommodate routing demands for the IC package layout design, determine a power layer and/or a ground layer based in part or in whole upon one or more factors, and generate an output for the IC package layout design based using at least the estimated number of layers and the power layer and/or the ground layer. These mechanisms use input including connectivity information, thermal effects, and/or IC placement information to determine estimates for the total number of layers, layer stack-up, power and ground plane assignment, and via libraries to guide IC package layout design.

20 Claims, 22 Drawing Sheets

Design Info (in microns)

| | |
|---|---|
| Package Area | 529000000.000 |
| Total Nets | 144 |
| Signal Nets | 141 |
| Power Nets | 3 |

Die Info(Inside Die)

| | |
|---|---|
| Rows | 12 |
| Cols | 31 |
| Signal Pins | 141 |
| Power/Gnd Pins | 226 |
| Trace-trace spacing(min) | 15 |
| Trace Width(min) | 15 |
| Ball Pitch | 151.200000 |

Package Info(Outside Die)

| | |
|---|---|
| Trace-Trace spacing | 30.000000 |
| Tracewidth | 50.000000 |
| Solder Bump | 484 |

[Reestimate]

Via list:

| Name | Start | End |
|---|---|---|
| VIA12_ESCAPE | L1 | L2 |
| VIA23_NEW | L2 | L3 |
| VIA13_ESCAPE | L1 | L3 |
| VIA35 | L3 | L5 |
| VIA56NEW | L5 | L6 |
| VIA34-CORE | L3 | L4 |
| VIA46 | L4 | L6 |
| VIA24_NEW | L2 | L4 |

[zoomout]  [save]

FIG. 8H-2

METHODS, SYSTEMS, AND COMPUTER PROGRAM PRODUCT FOR AN INTEGRATED CIRCUIT PACKAGE DESIGN ESTIMATOR

BACKGROUND

Integrated circuit (IC) designers often desire to know whether an IC package layout design that houses various intellectual property (IP) blocks therein may function properly as designed or intended so that these IP blocks function as designed or intended. In conventional approaches, IC designers are not aware of information such as how to design an IC package, given a die design for an IP block. IC designers may also find the information about the stack-up to be used in the IC package lacking and may not know how to interconnect the pins of the IP block to the outer periphery of the IC package layout design. Moreover, IC designers may also lack sufficient information to determine an appropriate number of power planes to be used in the IC package layout design. The information about the wire widths and/or spacing values as well as a via library that an IC package layout design need to accommodate may not be available for the IC package layout designers. Furthermore, IC package layout designers often do not have sufficient information to determine the optimal number of layers (e.g., signal layer(s), Vcc layer, GND layer, etc.) required for an IC package layout.

The unavailability of design related information may be due to the concerns of the IP block owners in protecting their interests in these IP blocks. The unavailability of design related information such as the information presented above may impede the utilization, sales, or acceptance rate of IP blocks. Oftentimes, an IP block with insufficient information for an IC package layout designer to properly design the IC package therefor leads to unnecessary development effort and/or cost due to the unavailability of some of the information listed above.

From the IC designers' perspective, an IC design needs to design an IC package such that the IC package properly accommodates the IC design therein. Nonetheless, IC designers are often given the pin count of the IP block design to be included in the IC design and the connectivity of the IP block design to the rest of the IC design. IC designers are often, however, not familiar with IC package layout designs, even for their own IC designs. IC package layout designers, on the other hand, typically start with IC package stack-up on a trial-and-error basis which often leads to non-optimal development or even sub-optimal identification of the number of IC package layers to layout the IC package layout design. For example, IC package layout designers often overuse layers to interconnect the IC package layout design and the IC design by using a trial routing process to reach a fully routed IC package layout design.

To exacerbate the complexity and issues, thermal analyses for IC package layout designs are often performed late in an IC package layout design cycle through post-route analyses or actual measurements on a manufactured IC package. These post-layout thermal analyses may lead to drastic changes to the IC package layout design or even re-layout for the new stack-up or a re-spin.

Therefore, there exists a need for a method, system, and computer program product for implementing an IC package layout design with an integrated circuit package design estimator.

SUMMARY

Disclosed are method(s), system(s), and article(s) of manufacture for implementing an IC package layout design with an integrated circuit package design estimator in various embodiments. Some embodiments are directed at a method for implementing an IC package layout design with an integrated circuit package design estimator. The method may determine an estimated number of layers for an integrated circuit (IC) package layout design including one or more IC die designs, determine whether the estimated number of layers suffice to accommodate routing demands for the IC package layout design, determine a power layer and/or a ground layer based in part or in whole upon one or more factors, and generate an output for the IC package layout design based using at least the estimated number of layers and the power layer and/or the ground layer in one or more embodiments.

In some of these embodiments, the method that determine the estimated number of layers may further determine an estimated number of layers for the IC package layout design, identify one or more fan-out inputs, and determine a set of priorities of routing direction for a fan-out pin of a plurality of fan-out pins of an IC die design of the one or more IC die designs in the IC package layout design. The one or more fan-out inputs include a netlist of the IC package layout design, geometric information of the IC package layout design, placement data for at least one of the one or more IC die designs, or information about power supplies to the IC package layout design. The method that determines the estimated number of layers may further optionally determine a set of characteristics upon which the estimated number of layers depends, determine a relation between the estimated number of layers and the set of characteristics, and determine the estimated number of layers for the IC package layout design using the relation.

In addition or in the alternative, the method that determines the estimated number of layers may determining a fan-out sequence for fanning out the plurality of fan-out pins, determining an estimated number of traces between two fan-out pins based in part or in whole upon one or more criteria, and determining a plurality of trace paths based in part or in whole upon the set of priorities in some embodiments. In some of these embodiments, the one or more criteria comprise one or more design rules and/or one or more characteristics of the IC die design, and the one or more characteristics include a total number of nets. The estimated number of layers for the IC packaged design may be incremented or decremented in some embodiments.

In some embodiments, the method that determines the set of priorities may identify the fan-out pin from the plurality of fan-out pins of the IC die design, partitioning the IC die design into a plurality of partitions, and Identifying a position of the fan-out pin in the IC die design. In some of the immediately preceding embodiments, the method may further identify a destination for the fan-out pin, and determine or update the set of priorities of routing direction using the destination as a guide. In determining the fan-out sequence, the method may further identify one or more fan-out pins of the plurality of fan-out pins, identify a default sequence for fanning out the IC die design, identify one or more sets of priorities of routing direction for the one or more fan-out pins, and identify one or more corresponding destinations for the one or more fan-out pins.

In some of the immediately preceding embodiments, the method may further determine whether potential routing for the one or more fan-out pins conflicts with one or more remaining fan-out pins of the IC die design, identify one or more other fan-out pins exhibiting similar priorities as the one or more fan-out pins and one or more corresponding sets of priorities of routing direction for the one or more remaining fan-out pins, and modify the default sequence for at least some of the plurality of fan-out pins that correspond to the one or more sets of priorities and the one or more corresponding sets of priorities.

In determining the estimated number of traces, the method may partition the IC design into multiple blocks, identify a block from the multiple blocks, identify one or more design rules and/or routing requirements, and determine the estimated number of traces based in part or in whole upon the one or more design rules and/or the routing requirements. In determining the plurality of trace paths, the method may identify the fan-out pin of the IC die design as a starting point for a search for viable routing solutions, identify the set of priorities of routing direction for the fan-out pin, and determine a partitioning scheme dividing the IC die design into a set of blocks in some embodiments. In some of these embodiments, the method may further identify a routing direction from the set of priorities of routing direction and one or more blocks from the set of blocks based in part or in whole upon the routing direction, identify one or more blocks having routing capacity for the pan-out pin from the set of blocks based in part upon the routing direction, and form a path by continuing the search in the routing direction until a stopping criterion is reached.

In addition or in the alternative, the method that determines the plurality of trace paths may further identify one or more repetitive or unneeded blocks, remove the one or more repetitive or unneeded blocks, determine a total number of blocks along the path, and determine whether or not the fan-out pin is pushed back into the fan-out sequence based in part upon the total number of blocks. In some embodiments, the method may identify power pins of a power net in the IC package layout design, group at least some of the power pins into a first grouping in a power domain, identify thermal effects, data, and/or requirements, and determine a number of power planes based in part or in whole upon the thermal effects, data, and/or requirements and results of grouping at least some of the power pins.

Some embodiments are directed at a hardware module or system that may be invoked to perform any of the methods, processes, or sub-processes disclosed herein. The hardware system may include one or more variants of a layout and stack-up estimation mechanism, a power and ground plane estimation mechanism, a trace estimation mechanism, a guideline and scheme generation mechanism, a prioritization mechanism, a trace path estimation mechanism, a partitioning mechanism, a fan-out sequence estimation mechanism, and/or a routing estimation mechanism in some embodiments. The hardware system may further include one or more forms of non-transitory machine-readable storage media or devices to temporarily or persistently store various types of data or information, extracted electronic circuit representations, various libraries, or any other suitable information or data, etc. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for characterizing an electronic system design including a parallel interface and analyzing the characterized the electronic system design by using channel analysis techniques are described below with reference to FIGS. 1-9.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 8H-1 and 8H-2 jointly illustrate an example of a via library generated by an IC package layout design estimator in one or more embodiments.

DETAILED DESCRIPTION

Figure 1A:
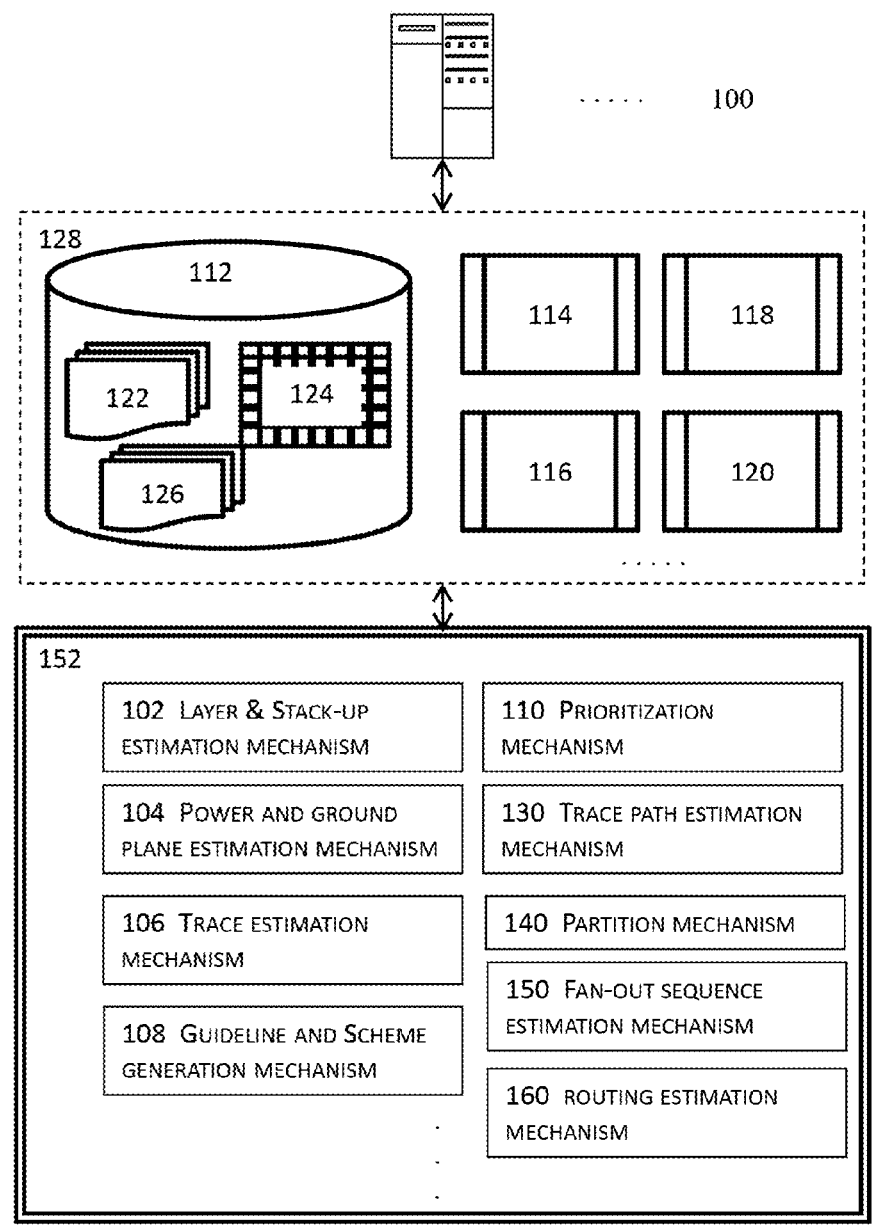
FIG. 1A illustrates a high level schematic block diagrams for a system for implementing an IC package layout design with an integrated circuit package design estimator in one or more embodiments.

Various embodiments of the invention are directed to a methods, systems, and articles of manufacture for implementing thermal circuit extraction for transient thermal analyses. Other objects, features, and advantages of the invention are described in the detailed description, figures, and claims.

In one or more embodiments, an EDA (electronic design automation) tool incorporating various techniques described herein may identify a size, the netlist information, and/or the footprint of an IC design as input to determine the stack-up for the IC package layout. In some of these embodiments, the approaches described herein identify the shortest paths for fan-out of the IC die design to provide guidance to designers. These approaches may further minimize the number of layers used for the IC die design in some of these embodiments. In some embodiments where the IC package layout design includes an IC die design, the IC die design includes an abstracted model of the actual IC die design, and the abstracted model includes the pin-out that is laid out on a boundary of the IC die design and is used to interconnect the IC die design to the corresponding pins of the IC package layout design or one or more other IC die designs thereof. In these embodiments, an IC die design may comprise the connectivity data including, for example, identifications of pins, information about one or more nets connecting a pin in the pin-out, or any other suitable information for interconnecting the IC die design, etc. In some of these embodiments, an IC die design contains only the boundary and the pin-out of the IC die design and does not include any other design data of the IC die design. In these embodiments, a boundary of an IC die design may comprise the footprint or a bounding box of the IC die design. In some other embodiments, an IC die design may include some or all design data (e.g., layout data) of the IC die design.

For example, the total number of layers for a fan-out design of an IC die layout may be minimized by using the identified shortest paths for the fan-out of the IC die layout. In these embodiments, the techniques described herein provide guidelines for IC fan-out designs and thus may result in a reduced or even minimal number of layers for the fan-out design and hence a more optimal IC design. These approaches may further reduce the cost of an IC package layout design by reducing or eliminating unnecessary, additional layers as well as trial routing in an IC package layout design. These approaches may also provide one or more technology files, one or more via libraries, and/or one or more IC die pins fan-out routing schemes.

In some embodiments, the mechanisms described herein may also perform escape routing to bring the pins of one IC die design to the periphery of another IC die design such that the distance of the one IC die design is shorter or even shortest to the destination pin on the another IC design. In these embodiments, the routing results may reduce subsequent routing optimization or even completely obviate subsequent routing optimization. In addressing the disadvantages of conventional approaches that perform thermal analyses for IC package layout designs late in an IC package layout design cycle through, for example, post-route analyses or actual measurements on a manufactured IC package, some embodiments may further ensure that the power-plane is configured in such a way that it undertakes the thermal effects caused by the IC die design in the IC package layout design.

In one or more embodiments, the techniques described herein identify an IC die footprint in an IC package layout design tool and identify. These embodiments may further insert interconnections between the IC die design and the IC package layout design by using, for example, the connectivity of the IC die design. For example, these embodiments may further identify a ball grid array (BGA) to interconnect the IC package layout design and the IC die design by using the connectivity information of the IC die design. For example, these embodiments may identify the dimensions of a BGA and use the identified dimensions together with the pin-out of the IC die design and the connectivity to estimate the total number of layers to be used for an IC package layout design for the IC die design of interest.

Signal assignments may be established for the IC die design in the IC package layout design tool, and routing constraints may be added to the IC package layout design. For example, design rules or constraints governing the widths or sizes of interconnects and spacing rules between interconnects may be associated with at least the interface components of the IC die design and the components in the IC package layout design fabric. These techniques described herein may provide a more efficient and more cost effective estimate of the IC package layout design and estimate of the IC package stack-up while reducing or even eliminating guess-work and trial routing.

The IC package layout design cycle time may also be reduced due to the reduced or minimal level of guess-work and trial routing that are often required or performed in conventional IC package layout design estimates. By reducing or eliminating guess-work and trial routing, these techniques described herein provide various estimates in a fast and efficient manner that designers may utilize these approaches to perform various what-if analyses. For example, designers may perform what-if analyses by changing, for example, the size or one or more dimensions of the ball grid array, by changing one or more design rules or constraints (e.g., spacing rule, width rule, thickness rule, etc.) in some embodiments. The designers may further modify the signal pin-outs of an IC die design based in part or in whole upon the what-if analyses.

For example, some approaches may identify the pin-out of an IC die design, the dimensions of a ball grid array interconnecting the IC die design and the IC package layout design, and the connectivity information to determine an estimate of the number of layers for implementing the IC package layout design. Some of these embodiments may further estimate the number of layers and/or the layer stack-up based further in part of in whole upon design rules or constraints including spacing rules, width rules, and/or thickness rules or constraints, etc. As another example, some techniques may determine signal assignment and use the determine signal assignment of an IC die design and the location of the IC die design in a system (e.g., an SoC or system on chip design) to determine an estimate for the fan-out routing of the IC die design.

As yet another example, some techniques may determine the power-plane assignment based in part or in whole upon the power-signal assignment and optionally upon the device heating effects. As another example, some techniques may determine the power plane assignment by identifying the power supplies being used in the design and the power-pin assignment. In some embodiments, the process for implementing an IC package layout design estimator includes generating an IC die symbol for an IC design. The act of generating an IC die symbol may further include importing IC die data. The IC die data that may be imported include for example, data from an IC die text file.

The act of generating an IC die symbol may further include assigning pin names, etc. to various data items in the IC die data. In addition, the act of generating an IC die symbol may also include determining die pad stack or loading the die pad stack. For example, the process may determine or load die pad stack from a library in some embodiments. Furthermore, the act of generating an IC die symbol may also include determining IC package information for the die design. The IC package information may include, for example, the names, the reference description, an attachment method for the die design (e.g., wire bond, flip chip, chip on top, chip at the bottom, etc.), dimensions, placement locations, etc. in some embodiments. Moreover, the act of generating an IC die symbol may include determining the IC die symbol in some embodiments.

The process for implementing an IC package layout design estimator may also include generating an IC package symbol. In some of these embodiments, the act of generating an IC package symbol may include importing IC package data. The IC package data may be imported from, for example, a BGA file that includes BGA design data in some embodiments or from an IC package layout design text file in some other embodiments. In some embodiments where the IC package data are arranged in a tabular form, the act of generating an IC package symbol may also include identifying coordinating the specification (e.g., the absolute coordinate system or relative coordinate system) and column delimiter (e.g., tab, semicolon, comma, space, or user-specified delimiters) for the IC package layout design in the tabular form.

In some of these embodiments, data that are specified in one or more columns of the tabular form may be identified to set pad stack information (e.g., circular or rectangular pad shape, width and/or height of pad dimensions, etc.). In addition or in the alternative, IC package information (e.g., placement information or location, dimensions including width and/or height or coordinates of a vertex, a name of IC package layout design, and/or resource description of the IC package, etc. may be determined. Moreover, an IC package symbol may be generated.

The process for implementing an IC package layout design estimator may also include executing the estimator module to determine an estimator output including, for example, the total number of layers, the minimum number of layers, the layer stack-up, the technology file that includes, for example, layer stack-up and/or design rules, and/or a via library etc. The process may determine the number of layers by using information or data including, for example, the number of pins on the IC die to be enclosed within the IC package, the signal assignment on the pins of the IC die, the number of connections to the external environment of the IC package, the size of the IC package layout design, the power planes and ground planes needed for controlling impedance, providing a reference plane, and/or accommodating thermal effects, and/or one or more manufacturing constraints on, for example, the width values, the spacing values, and/or vias.

A via library may include, for example, via structures, via list, etc. in some embodiments. A symbolic representation of layer stack-up and planes may be optionally generated and presented on a display apparatus. In some of these embodiments, the act for executing the estimator module may include creating the maximum number of inter plane capacitors and removing one or more decap cells inside the IC package layout design and improving EMC (electromagnetic coupling) performance to improve or optimize the insertion or placement of decap cells. A decap cell may include a plurality of poly gate transistors where the source and drain are connected to a ground rail, and the gate is connected to a power rail. Nets may be automatically assigned to a via list including a plurality of vias based in part or in whole upon a technology file for the IC package layout design.

The process for implementing an IC package layout design estimator may also include importing the technology file into the design tool. In addition, a set of rules including, for example, spacing rules, physical design rules, region rules, etc. may be determined. The IC package layout design may thus be implemented with the estimates and stack-up provided by the estimator module. The IC package layout design may be further routed based in part or in whole upon the estimates and determining planes. In addition or in the alternative, shape degassing at outer layers may be determined by at least identifying information that includes, for example, void array parameters (e.g., void shape, void size, void separation, void pitch, etc., starting position, offset in horizontal and/or vertical direction, void spacing constraints, the minimum size of shapes for shape degassing, parameters of void to shape boundary, void to same layer conductor, and/or void to adjacent layer conductor in some embodiments. Once the design is complete, design signoff may be performed by performing base checks, performing electrical checks, removing electrical design rule checks, checking reports of the estimator modules, and/or checking other documentation of the estimator modules.

In some embodiments, the process for implementing an IC package layout design estimator includes identifying information including a netlist of an IC die design, the IC package size or dimensions, and/or the placement data of the IC die design and using at least the identified information as an input to assign a direction to each pin of the IC die design. Fanning sequence of pins of the IC die design may be determined. In addition, the number of traces between two pins of the IC die may be estimated by taking into account, for example, the minimum trace to trace spacing and the distance between the two pins. One or more trace paths may be determined by using, for example, the recursive path searching process based in part or in whole upon the direction priority set of each pin of the IC die design.

The process may return to estimating the number of traces that may be determined between the two pins of the IC die design if one or more die pins do not fan out. In these embodiments, the priority set of a pin in an IC die design may act as a base in estimating the trace direction and may include a set of labels (e.g., left, right, upper, lower, etc.) that indicate which direction is to be associated with a higher priority. The priority set of a pin may be determined by using factors including, for example, the position of the pin in the IC die design and/or the position of the corresponding destination die pin or the corresponding solder ball although the mechanisms described herein may assign initial priorities to pins without considering the position of the die pin or the position of the destination die pin.

The initial priorities may be overridden by the position of the corresponding destination pin or solder ball. The mechanisms may further include determining a fan out sequence. In some of these embodiments, the fan out sequence may include a default sequence of fanning out which is from the outer pins to inner pins. That is, in the default sequence of fanning out, outer pins at the border are fanned out first and then the inner pins. In some other embodiments where the position of the corresponding die pin is taken into account and where fan out sequence is not adjusted, the number of signal layers may increase. In some embodiments where the priority set changes (e.g., where the direction priority of the destination die pins changes), the sequence of fanning out may also change accordingly to incorporate the change in the priority set.

In some embodiments, the process for implementing an IC package layout design estimator may further include estimating the number of traces that may be drawn between two pins. In some of these embodiments, an IC die design may be divided into a set of blocks where each block represents the space between the die pins and acts as a carrier of traces. In addition or in the alternative, if the sum of the trace to trace spacing and the trace width is smaller than the pitch of the IC die or a block thereof, the block may carry more than one set of traces through the block. The process may further comprise determining a plurality of paths for the estimator module in some embodiments by using the priority set as a starting point and searching a plurality of blocks of the IC die design in the first direction of the priority set.

In some embodiments where there are no available blocks in the first direction of the priority set, the process may proceed with a second direction or a subsequent direction of the priority set may be selected from the priority set to determining the paths of interest. In some embodiments where the paths determined may be associated with one or more repetitive or unneeded blocks, these one or more repetitive or unneeded blocks may be removed. If a number of blocks in a path exceeds a certain length, the path may be pushed back into the fanning sequence to ensure minimal trace length. In some embodiments, a maximum number (e.g., the greater number between (C1×rows) and (C2× columns) where C1 and C2 are the same or different constants) of blocks may be imposed to ensure that the fan out routing is not meandering and including unnecessary long paths.

Some other embodiments are directed at methods, systems, and articles of manufacture for performing channel analyses for a communication interface of an electronic system. In these embodiments, the method or system applies an input stimulus to each of a number of transmitters of a circuit design model including at least one parallel interface and one serial interface, determines the responses to the input stimulus at each of a number of receivers of the parallel interface and the receiver of the serial interface by performing a single circuit simulation, instead of multiple circuit simulations, in a time domain on a general purpose circuit simulator, and determines the waveform responses of the circuit design model with respect to input signals by using channel analysis techniques on the responses to the input stimulus at the receivers of the parallel interface and the serial interface, without performing circuit simulations or conventional time-stepping or domain discretizing simulations.

In these embodiments, the method or system may analyze the interactions such as the simultaneous switching noise, the intersymbol interferences, etc. between the parallel interface and the serial interface by characterizing the parallel and serial interfaces to determine their responses to input stimuli and determining the waveform responses of the circuit design model by channel analysis without performing simulations to obtain the waveform responses to input signals for the circuit design model including the parallel and serial interfaces.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

FIG. 1A illustrates a high level schematic block diagrams for a system for implementing an IC package layout design with an integrated circuit package design estimator in one or more embodiments. In one or more embodiments, the system illustrated in in FIG. 1A may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine, an IC package layout routing engine, and/or a detail routing engine 114, a layout editor or an IC package layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), various data, rule decks, constraints, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprises a layer and stack-up estimation mechanism 102 to estimate information or data about the layers and layer stack-up of integrated circuit (IC) designs, a power and ground plane estimation mechanism 104 to determine estimates for information or data about power and ground planes, trace estimation mechanism 106 to determine information or data about traces, guideline and scheme generation mechanism 108 to generate various output files or objects including various guidelines and schemes, a prioritization mechanism 110 to determine one or more sets of priorities of routing direction for fan out pins of IC designs, a trace path estimation mechanism 130 to estimate trace paths for fanning out IC pins to IC package ball bumps or to pins of another IC design in an IC package, a partition mechanism 140 to partition a design into smaller partitions or blocks, a fan-out sequence estimation mechanism 150 to determine fan-out sequences for fanning out IC pins to IC package ball bumps or to pins of another IC design in an IC package, and/or a routing estimation mechanism 160 to generate geometric or estimated traces between IC fan out pins and IC package ball bumps or to pins of another IC design in an IC package. More detailed about these mechanisms will be described below with reference to FIGS. 2-8A.

Figure 1B:
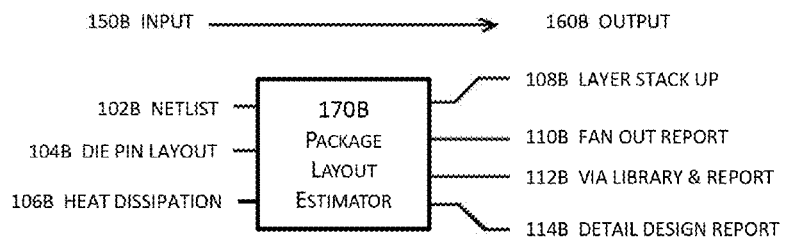
FIG. 1B illustrate a simplified diagram of an integrated circuit package design estimator and some examples of various inputs and outputs thereof in one or more embodiments.

FIG. 1B illustrate a simplified diagram of an integrated circuit package design estimator and some examples of various inputs and outputs thereof in one or more embodiments. An IC package layout design estimator 170B may receive various inputs 150B to various functions, perform these functions, and generate output 160B. Some examples of inputs 150B may include a netlist 102B in the IC package layout design fabric interconnecting an IC die design to the IC package layout design or interconnecting multiple IC die designs in an IC package layout design, an IC die pin layout 104B, heat dissipation data 106B obtained by thermal analyses or actual measurement data, etc.

Some examples of the output 160 generated by the IC package layout design estimator 170B may include graphical or textual layer stack-up data 108B indicating the number of layers of an IC package layout design and how these layers are stacked atop each other, fan-out guideline and/or reports 110B including information or data of fanning out IC die pins to IC package ball bumps or pins of another IC or information or data for guiding IC die pin fan-out. Other examples of output 160B generated by the IC package layout estimator 170B may include the via library and/or report comprising information or data of various vias, their respective structures, and/or the corresponding layer information, a detail IC package layout design report 114B comprising various information or design data of the IC package layout design generated by the estimator.

Figure 2:
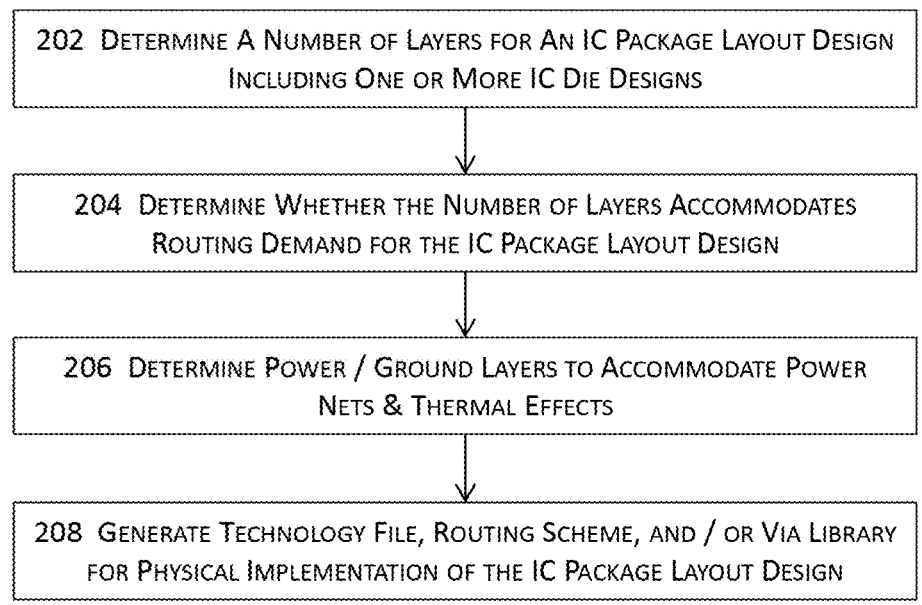
FIG. 2 illustrates a high-level block diagram for implementing an IC package layout design with an integrated circuit package design estimator in one or more embodiments.

FIG. 2 illustrates a high-level block diagram for implementing an IC package layout design with an integrated circuit package design estimator in one or more embodiments. In these one or more embodiments illustrated in FIG. 2, an IC package layout design estimator may determine an estimated number of layers for an IC package layout design that includes one or more IC die designs at 202. For example, the IC package layout design estimator may identify the netlist and/or connectivity information in the IC package layout design fabric, the IC package layout design footprint, IC pin layout(s) of the IC die design(s) included in the IC package layout design, thermal analysis data, etc. to automatically estimate the number of layers required or desired for the IC package layout design. Some of these embodiments illustrated in FIG. 2 determine the number of layers that may be used to accommodate the fan-out routing that interconnects, for example, IC die bumps with the peripheral of the IC package layout design. The IC package layout design estimator may further fine tune the estimated number of layers to better improve or optimize the IC package layout design.

Moreover, the IC package layout design estimator may determine a number of layers and the layer stack-up to accommodate estimated (e.g., topological traces) or geometric (e.g., geometric traces) trace paths for successfully routing the IC package layout design fabric by eliminating guesswork and successive trial routes such that the underlying computing systems performing various tasks need much fewer clock cycles and less processor utilization and thus do not have to perform as much computation to reach an optimal or improved IC package layout design. In addition, the underlying computing system or the processor needs far fewer network round-trips via network elements and/or much fewer IO (input/output) requests for design data via various bus architectures (e.g., a system bus in a processor or external bus in a computing system to access peripherals) because trial routing and guess work may be completely avoided.

At 204, the IC package layout design estimator may determine whether the estimated number of layers for the IC package layout design accommodates the routing demand between the one or more IC die designs and discrete components in the IC package layout design. For example, the IC package layout design estimator may determine the routing capacity provided by these layers, increase the number of layers if the estimated or actual routing demand exceeds the routing capacity provided by the number of layers, or decrease the number of layers if the estimated or actual routing demand may be distributed among a decreased number of layers. These embodiments illustrated in FIG. 2 determine, at 204, the estimated number of layers that are used to accommodate the routing from an IC die design to the other instances (e.g., one or more instances of IC die designs, discrete components, etc.) in the IC package layout design.

Some of these embodiments may determine the number by using the following equation:

$$\text{The Estimated Number of Layers} = \{[K \times (W + \alpha \times S) \times N^\beta] / [\gamma \times B]\} \quad (1)$$

In the above equation (1), W denotes the width of trace, S denotes the spacing value between traces, N denotes the number of nets, B denotes a board index indicating which area is available per net, and α, β, and γ denote some constants. To determine the estimate for the power planes, the estimator engine or module determines an estimate of the number of ground planes and the number of power planes for an IC package based in part or in whole upon the power consumption or dissipation of the IC die design. In some embodiments, the constants α, β, and γ may be determined empirically or through design of experiments (DOE). In one of these embodiments, α=1.1, β=0.2, and γ=1.06.

In some embodiments, the results of Eq. (1) may be rounded off, rounded up, or rounded to the nearest integer to determine the estimated number of layers. The estimated number of layers determined with Eq. (1) above includes the estimate of the number of layers that may be used for routing of a fan-out die to the remaining instances in the IC package layout design in some embodiments. In some embodiments, one or more of the constants α, β, and γ may be refined or updated by using the data related to one or more other IC package layout designs that have run through the estimator and their respective estimates of the numbers of layers for these one or more IC package layout designs. For example, the estimator mechanism may compare the estimated number of layers of a first IC package layout design to its final number of layer to update one or more of the constants α, β, and γ via, for example, design of experiments.

At 206, the power and ground planes for the IC package layout design and/or the power or ground areas in a layer of the IC package layout design. Power planes and ground planes may be used for controlling impedance, providing reference planes, or enhancing heat dissipation of the IC package layout design. A power plane may be inserted to provide a short close loop path for electrical currents and may act as a reference for one or more signals in the design in one or more embodiments. A ground plane may be inserted to reduce EMC (electromagnetic coupling) emissions and may also act as a reference for one or more signals in one or more embodiments. At 208, the IC package layout design estimator may generate various outputs including, for example, technology file(s), routing scheme(s) in the IC package layout design fabric, a via library, etc. for physical implementation of the IC package layout design. More details about these mechanisms illustrated in FIG. 2 and described above will be provided below with reference to FIGS. 3A-8A.

Figure 3A:
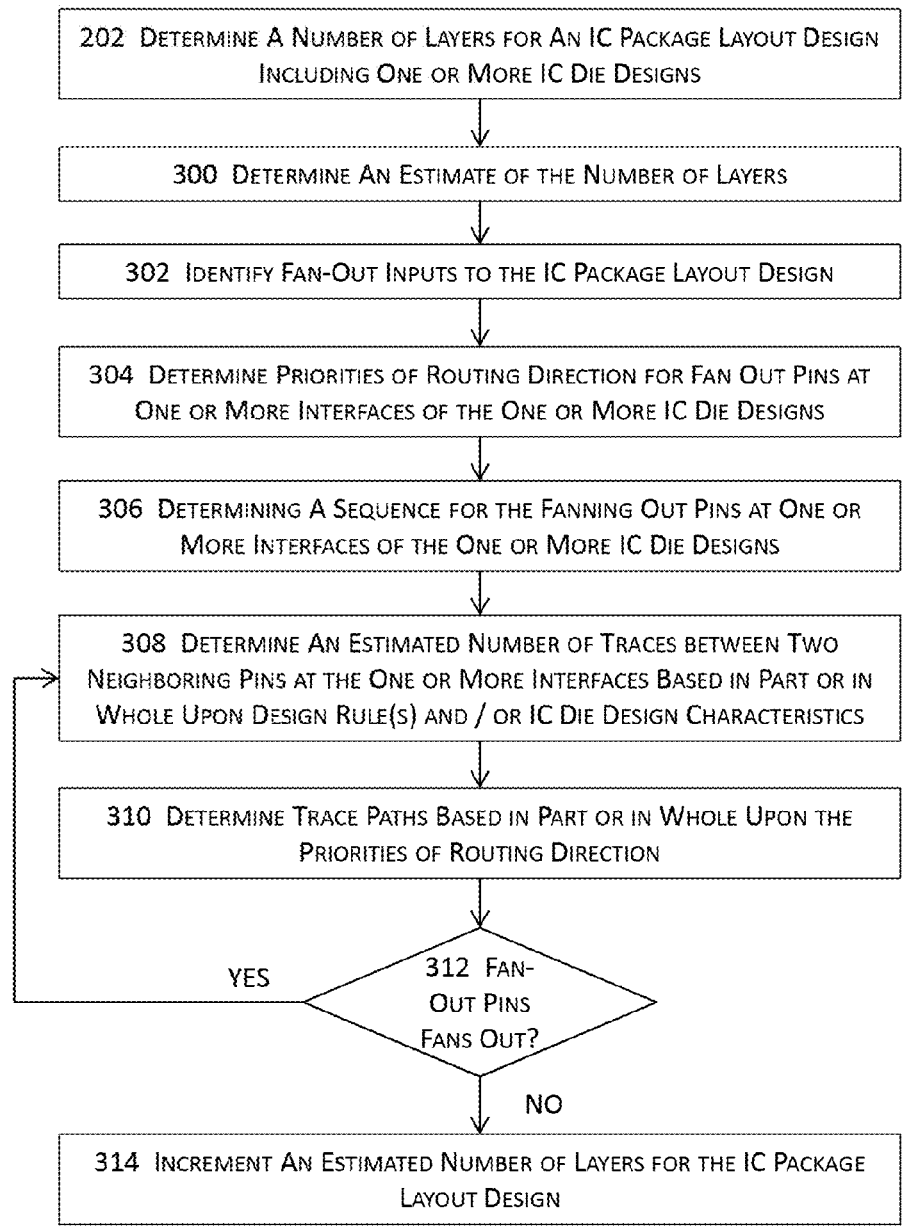
FIG. 3A illustrates a more detailed block diagram for a block illustrated in FIG. 2 for implementing an IC package layout design with an integrated circuit package design estimator in one or more embodiments.

FIG. 3A illustrates a more detailed block diagram for a block illustrated in FIG. 2 for implementing an IC package layout design with an integrated circuit package design estimator in one or more embodiments. More specifically, FIG. 3A illustrates more details about reference numeral 202 of FIG. 2. In these one or more embodiments illustrated in FIG. 3A, an estimate of the number of layers of an IC package layout design may be determined at 300. More details about the determination of an estimated number of layers will be provided in the description with reference to FIG. 3B.

At 302, one or more inputs for fanning out an IC die design may be identified. In some embodiments, the one or more inputs may include a netlist of the IC package layout design in the IC package layout design fabric in some embodiments. The netlist includes the nets in the IC package layout design fabric such as the nets connecting the IC die design fan-out pins to the corresponding die bumps of the IC package layout design and/or the nets connecting the fan-out pins of an IC die design to the corresponding pins of another IC die design in the same IC package layout design in these embodiments. In some of these embodiments, the netlist does not include the nets routed entirely within an IC die design. In addition or in the alternative, the one or more inputs may also include characteristics (e.g., physical dimensions, the footprint, etc. of the IC package layout design), placement data of one or more IC die designs in the IC package layout design, information about the power supplies to the IC package layout design, and/or heat dissipation data or requirements, etc.

At 304, a prioritization mechanism (e.g., the prioritization mechanism 110 of FIG. 1) including or working in conjunction with a micro-processor may determine a set of priorities of routing direction for a fan-out pin of an IC die design. For example, the prioritization mechanism may determine that, for a first fan-out pin of an IC die design, the priorities for fanning out this first fan-out pin is first the upward direction followed by the leftward direction, then downward direction, and the rightward direction the last (e.g., ULDR). In estimating or implementing the fan-out trace for the first fan-out pin, a routing engine or the IC package layout design estimator may first search in the upward direction to find viable routing solution, then leftward direction, and so forth according to the priorities corresponding to the first pin.

At 306, the fan-out sequence estimation mechanism (e.g., 150 of FIG. 1A) including or working with at least one processor may, either alone or in conjunction with one or more other mechanisms, determine a sequence for fanning out pins at one or more interfaces of one or more IC die designs. Fanning out pins at an interface of an IC die design including determining estimated (e.g., topological traces) or geometric (e.g., actually laid-out traces) traces (e.g., interconnects) from the pins of an IC die design to the corresponding die bumps of the IC package layout design or to the corresponding pins of another IC die design in the same IC package layout design. The sequence for fanning out pins includes the order of processing each pin of the total number of pins or each group of pins of the total number of pins of the IC die design. In other words, the sequence may include an order for a pin or an order for a group of a plurality of pins in which the pin or the group will be fanned out.

At 308, a trace estimation mechanism (e.g., 106 of FIG. 1A) may determine an estimated number of traces between two neighboring pins at the one or more interfaces based in part or in whole upon one or more design rules and/or one or more IC die design characteristics. In one or more embodiments, the one or more design rules may include, for example, one or more spacing rules between two immediately neighboring traces, one or more spacing rules between a trace and a pin or a die bump, design rules governing vias sizing, insertion, enclosure, and/or stacking, etc. The one or more IC design characteristics may include, for example, trace width, a total number of nets for fanning out IC die design fan-out pins to other IC die design(s) or to the IC package layout design, etc. in some embodiments.

At 310, a routing estimation or implementation mechanism (e.g., 160 of FIG. 1A) may determine trace paths based in part or in whole upon the priorities of routing direction for fan-out pins. The trace paths determined at 310 may include topological trace paths, which generally indicate how source pins are connected to their corresponding pins or die bumps and hence resemble global routes in IC designs in some embodiments or geometric routes that actually represent the geometric or layout data of these trace paths between sources and destinations and hence resemble detail routes in some other embodiments. In some embodiments, the routing estimation or implementation mechanism may identify a sequence of connected blocks in the IC package layout design from a fan-out pin under consideration to its destination by selecting blocks providing sufficient routing capacity to accommodate the trace path.

At 312, the IC package layout design estimator may invoke at least one processor to determine whether the fan-out pins under consideration fan out to their respective destinations by examining the fan-out pins and the determined trace paths. If the determination is affirmative, the process may loop back to 308 to identify another fan-out pin of interest and repeat the processes described above until all fan-out pins are processed. In some other embodiments where it is determined that a fan-out pin does not fan out properly to its destination at 312, the layer estimation mechanism (e.g., 102 of FIG. 1A) may increment the number of layer for the IC package layout design at 314.

Figure 3B:
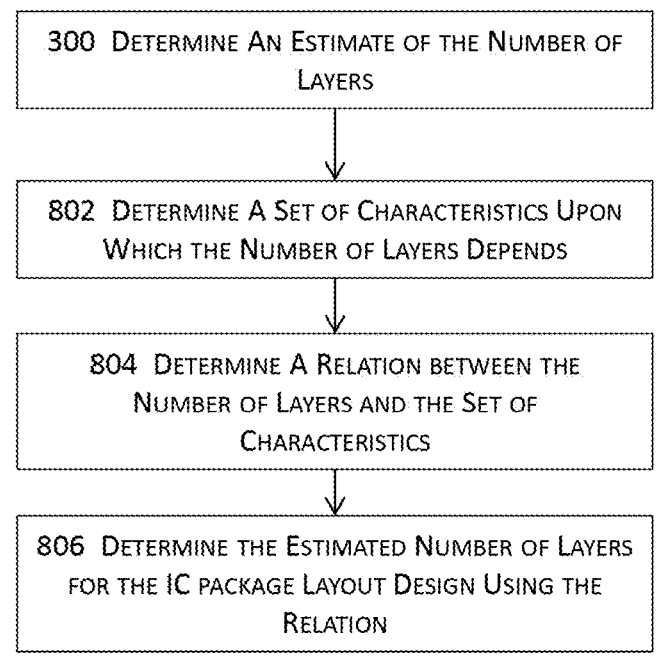
FIG. 3B illustrates a more detailed block diagram for a block illustrated in FIG. 3A for implementing an IC package layout design with an integrated circuit package design estimator in one or more embodiments.

FIG. 3B illustrates a more detailed block diagram for a block illustrated in FIG. 3A for implementing an IC package layout design with an integrated circuit package design estimator in one or more embodiments. More specifically, FIG. 3B illustrates more details about block 300 of FIG. 3A where an estimate of the number of layers of an IC package layout design may be determined. In these one or more embodiments illustrated in FIG. 3B, the layer and stack-up estimation mechanism (e.g., 102 of FIG. 1A) may determine a set of characteristics upon which the estimate of the number of layers depend at 802.

The set of characteristics may include, for example, one or more widths of traces, one or more spacing values between two immediately neighboring traces, one or more spacing values between a trace and a fan-out pin or a die bump, the total number of nets in the IC package layout design fabric, and/or the board index which includes the average design area per net, etc. At 804, a relation between the estimated number of layers and the set of characteristics. In some embodiments, each characteristic in the set may be used as a control variable in a design of experiment (DOE) to determine the relationship between the estimated number of layers and the characteristics. In one embodiment, Eq. (1) presented above may be used to represent the relation. At 806, the layer and stack-up mechanism may determine the estimated number of layers for the IC package layout design using the relation determined at 804.

Figure 4A:
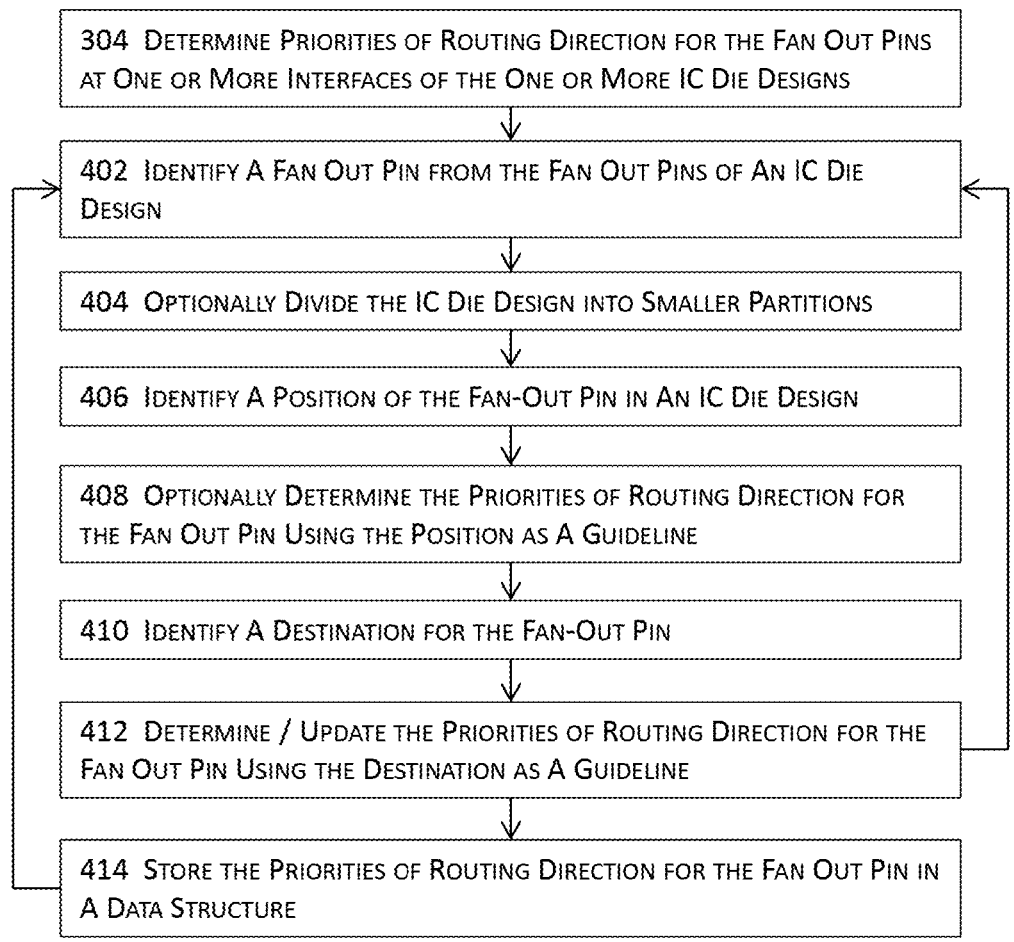
FIG. 4A illustrates a more detailed block diagram for a block illustrated in FIG. 3A for implementing an IC package layout design with an integrated circuit package design estimator in one or more embodiments.

FIG. 4A illustrates a more detailed block diagram for a block illustrated in FIG. 3A for implementing an IC package layout design with an integrated circuit package design estimator in one or more embodiments. More specifically, FIG. 4A illustrates more details about block 304 of FIG. 3A. In these one or more embodiments illustrated in FIG. 4A, the prioritization mechanism (e.g., 110 of FIG. 1A) including or functioning in conjunction with at least one processor may invoke the at least one processor to executing instructions to identify a fan-out pin of an IC die design at 402. The IC die design or the layout of the fan-out pins (e.g., the layout including only the fan-out pins) may be optionally partitioned into multiple smaller partitions at 404 in some embodiments.

Figure 4B:
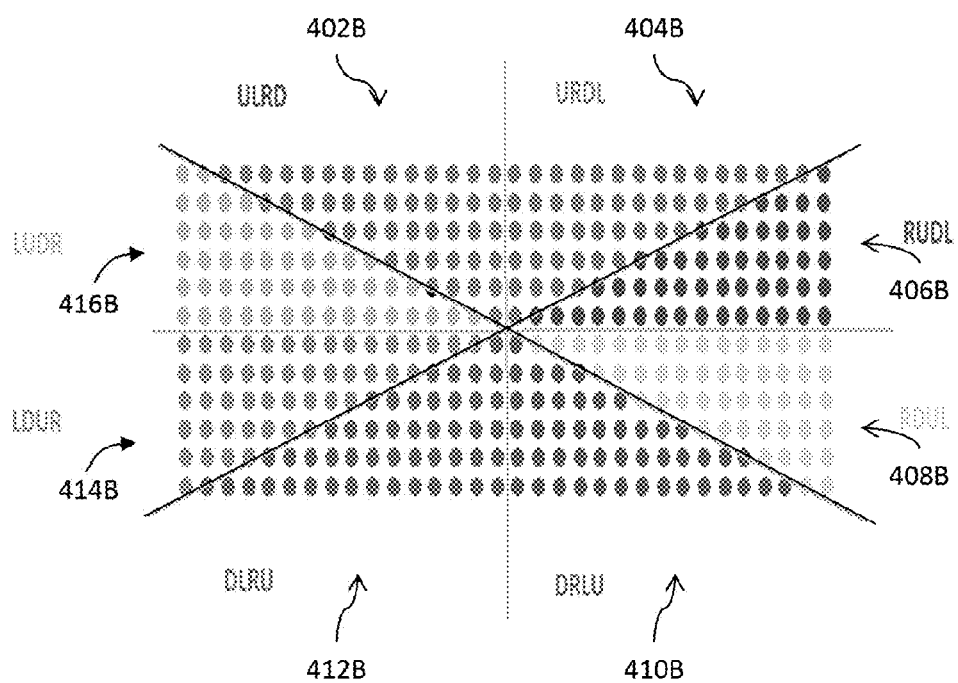
FIG. 4B illustrated a graphic example of a set of integrated circuit fan out pins that has been partitioned into octants with respective initial priorities of routing direction for the fan out pins in one or more embodiments.

In one embodiment, the design may be partitioned into octants as illustrated in FIG. 4B which depicts a graphic example of a set of integrated circuit fan out pins that has been partitioned into octants with respective initial priorities of routing direction for the fan out pins in one or more embodiments. At 406, the position of the fan-out pin identified at 402 may be identified. In some embodiments, the position need not indicate the exact coordinates of the fan-out pin. Rather, only the partition in which the fan-out pin is located needs to be identified. For example, the location of a fan-out pin may indicate that the fan-out pin is located in the upper right octant of the design space.

In some other embodiments, the absolute or relative coordinates of the fan-out pin or a reference point therein may be identified at 406. At 408, the prioritization mechanism may optionally determine the initial priorities of routing direction for the fan-out pin using the identified position as a guide. In the example illustrated in FIG. 4B, the prioritization mechanism may determine the priorities of routing direction for first fan-out pins in the upper left octant 402B to be, in the order from the highest priority to the lowest priority, upward, leftward, rightward, and downward (or ULRD as shown in FIG. 4B).

The prioritization mechanism may similarly determine the priorities of routing direction for 404B, 406B, 408B, 410B, 412B, 414B, and 416B to be, for example, URDL, RUDL, RDUL, DRLU, DLRU, LDUR, and LUDR, respectively. At 410, the prioritization mechanism may identify a destination for the fan-out pin identified at 402. The prioritization mechanism may then determine (if non-existing) or update (if already existing) the priorities of routing direction for the fan-out pin at 412 based in part or in whole upon the destination of the fan-out pin. A set of priorities of routing direction may include a set of labels or flags that signifies the order of directions of search to a routing mechanism to find a viable routing solution in some embodiments. In some embodiments, the priorities may be determined on a pin-by-pin basis.

In some other embodiments, the priorities of routing direction may be determined for a group of multiple fan-out pins. For example, the prioritization mechanism may determine the priorities for all the fan-out pins in an octant altogether. At 414, the priorities of routing direction for the fan-out pin identified at 402 may be stored in a data structure, and the flow may return to 402 to identify another fan-out pin or another group of fan-out pin to repeat the flow 402 through 414 until the priorities of routing direction for all fan-out pins or all groups of fan-out pins are determined.

Figure 5A:
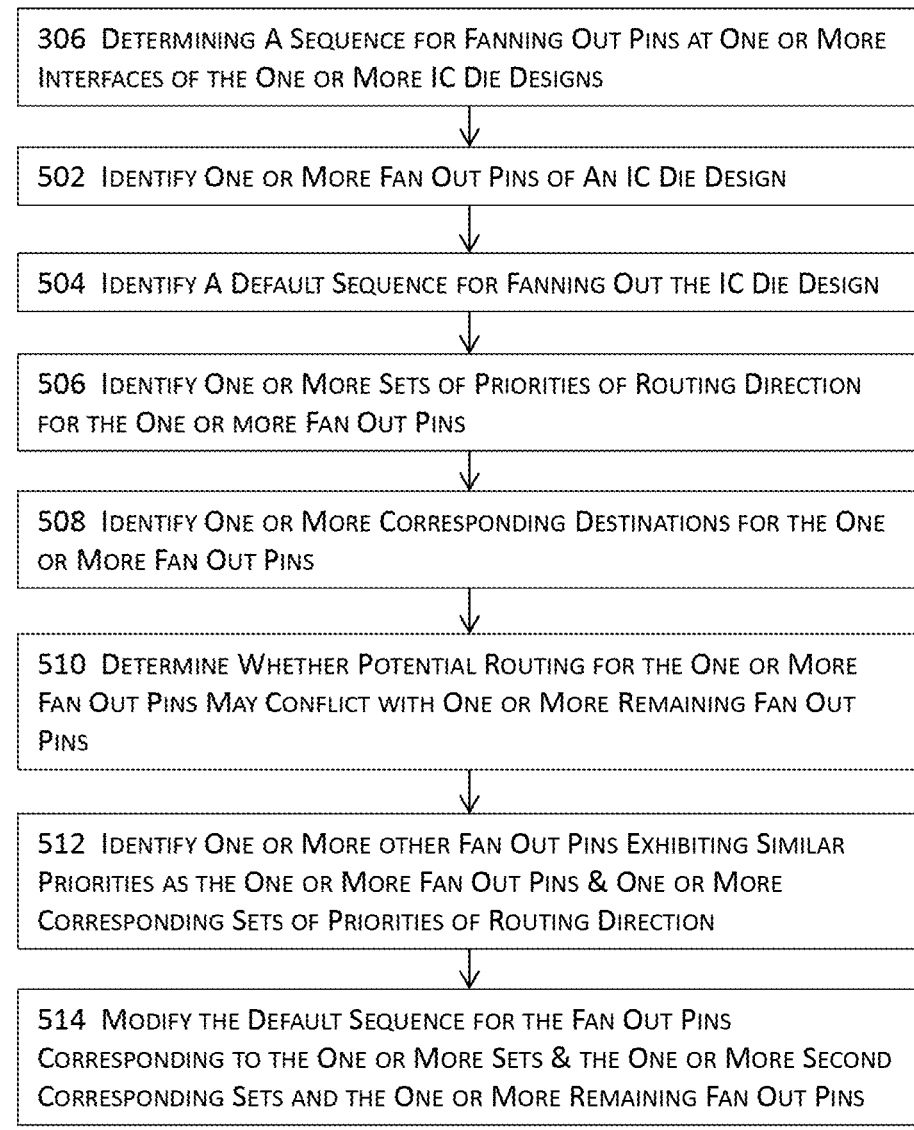
FIG. 5A illustrates a more detailed block diagram for a block illustrated in FIG. 3A for implementing an IC package layout design with an integrated circuit package design estimator in one or more embodiments.

FIG. 5A illustrates a more detailed block diagram for a block illustrated in FIG. 3A for implementing an IC package layout design with an integrated circuit package design estimator in one or more embodiments. More specifically, FIG. 5A illustrates more details about block 306 of FIG. 3A. In these one or more embodiments, a fan-out sequence estimation mechanism (e.g., 150 of FIG. 1A) including or functioning in conjunction with at least one processor may invoke the processor to execute instructions to identify one or more fan-out pins of an IC die design at 502 and identify a default sequence for fanning out fan-out pins of an IC die design at 504. In one embodiment, a default sequence may include a sequence in which outer fan-out pins are fanned out before inner fan-out pins. The fan-out sequence, like the priorities of routing direction, may be determined for each pin in some embodiments and for each group of multiple pins of a plurality of groups in some other embodiments such that each group is fanned out according to its relative position in the fan-out sequence.

Figure 5B:
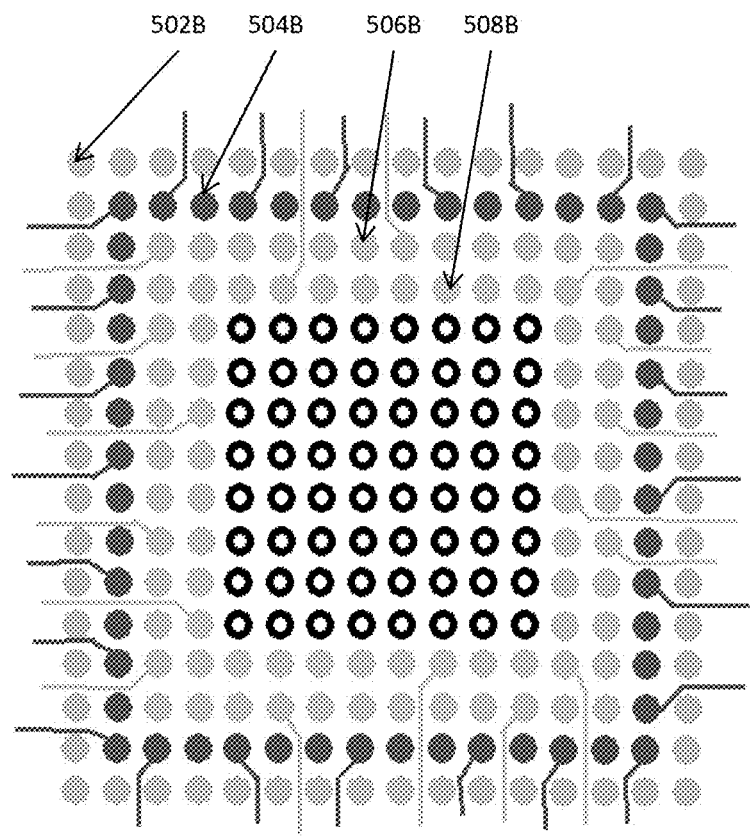
FIG. 5B illustrates an example of a sequence for fanning out pins of an integrated circuit design in one or more embodiments.

In some of these embodiments where a fan-out sequence is determined on a group by group basis, more detailed fan-out sequence for the individual pins in a group may be further determined. In one or more embodiments where a default fan-out sequence in which outer fan-out pins are fanned out before inner fan-out pins, the fan-out sequence estimation mechanism may determine the fan-out sequence such that the outer fan-out pins 502B are fanned out before fan-out pins 504B; fan-out pins 504B are fanned out before fan-out pins 506B; and fan-out pins 506B are fanned out before fan-out pins 508B as illustrated in FIG. 5B.

At 506, one or more sets of priorities of routing direction may be identified. For example, the fan-out sequence estimation mechanism may identify the default set of priorities of routing direction at 506 for the one or more pins identified at 502. At 508, one or more destinations corresponding to the one or more fan-out pins may be identified. The fan-out sequence estimation mechanism may use the destinations of fan-out pins to determine whether or not the default fan-out sequence is to be modified or adjusted to improve the utilization of the design space to accommodate more traces for fanning out the pins of an IC die design to the IC package layout design or to another IC die design.

At 510, the fan-out sequence estimation mechanism may either function alone or in conjunction with one or more other mechanisms to determine whether potential routing from the one or more fan-out pins identified at 502 may conflict with one or more remaining fan-out pins. In some of these embodiments, the potential routing of a fan-out pin conflicts with a remaining fan-out pin if the potential routing of the fan-out pin blocks one or more priorities of routing direction of the remaining fan-out pin. Whether or not potential routing of a fan-out pin conflicts with a remaining fan-out pin may be determined based in part or in whole upon one or more priorities of routing directions of the remaining fan-out pin and one or more priorities of routing directions of the fan-out pin.

For example, the fan-out sequence estimation mechanism may invoke at least one processor to determine whether a potential routing blocks the first two routing directions with higher priorities. As a practical example illustrated in FIG. 5C, which illustrates an example of some incomplete trace routing for fanning out some pins of the integrated circuit design illustrated in FIG. 5B in one or more embodiments, the priorities of routing direction for fan-out pin is DLRU, and the priorities of routing direction for fan-out pin 510C is also DLRU. In this example, the potential routing 506C for fan-out pin 504C blocks the first two priority routing directions (downward and leftward) because the potential routing 506C potentially bocks the downward and leftward routing direction for fan-out pin 510C. It shall be noted that it is assumed in this example that the spacing between two fan-out pins is insufficient to accommodate two traces such that the potential routing 506C occupies the space that may be utilized to fan out the fan-out pin 510C in the first two priority routing direction. Fan-out pins 502C and 504C in FIG. 5a are similarly blocked by various other potential routing or traces.

Referring back to FIG. 5A, the fan-out sequence estimation mechanism may, at 512, identify one or more other fan-out pins that exhibit similar priorities as the one or more fan out pins identified at 502. The fan-out sequence estimation mechanism may further identify one or more corresponding set of priorities of routing direction for the one or more other fan-out pins at 512. A first fan-out pin is considered similar to a second fan-out pin if the first set of priorities of routing direction includes one or more mirroring priorities against a horizontal or a vertical axis in one or more embodiments.

For example, a first pin having DLRU priorities of routing direction may be consider to exhibit similar priorities as a second pin having DRLU priorities of routing direction because the mirroring routing direction of the leftward routing direction against the vertical axis is the rightward routing direction. Similarly, a first pin having DLRU priorities of routing direction may be considered to exhibit similar priorities as a second pin having URLD priorities of routing direction. For example, the fan-out sequence estimation mechanism may examine the potential routing for fan-out pin 508 to determine that the potential routing may conflict with fan-out pin 510C.

Figure 5C:
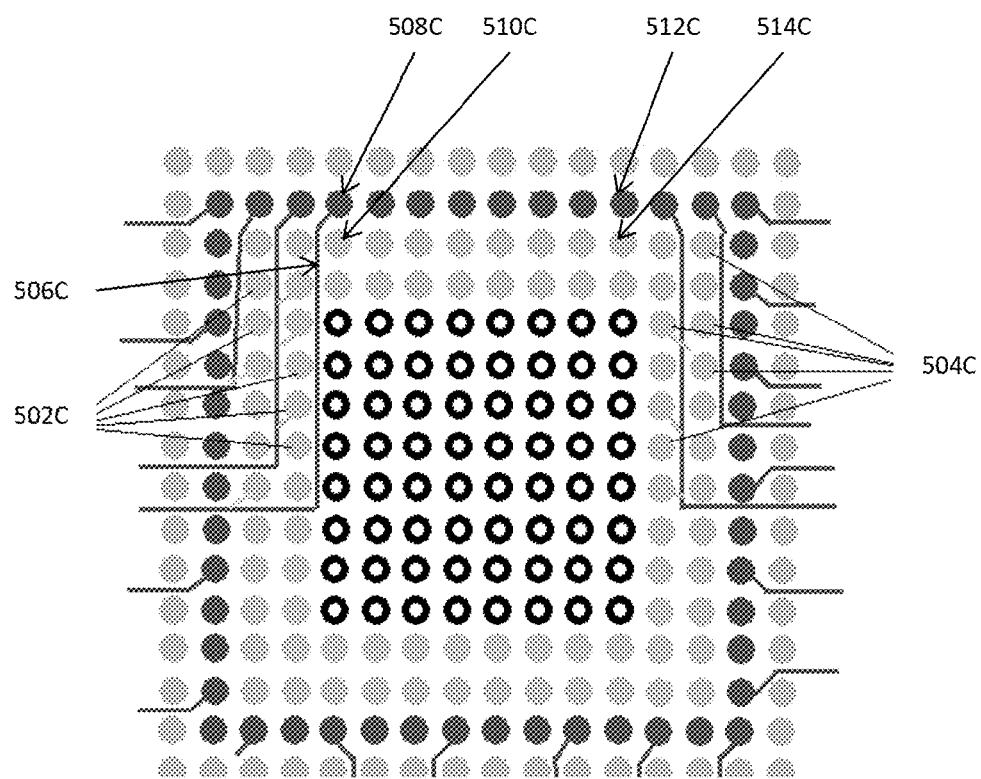
FIG. 5C illustrates an example of some incomplete trace routing for fanning out some pins of the integrated circuit design illustrated in FIG. 5B in one or more embodiments.

With this determination, the fan-out sequence estimation mechanism may further identify two remaining fan-out pins 512C and 514C together with one or more other fan-out pins in, for example, the same octant that are associated with the same set of priorities of routing direction, without using any processor cycles or computation resources to determine whether these remaining fan-out pins may conflict with some potential routing (although the potential routing of certain fan-out pins may actually conflict with fan-out pins 512C and 514C as illustrated in FIG. 5C.) Rather, the fan-out sequence estimation mechanism may directly identify fan-out pins 512C and 514C and maybe other remaining fan-out pins having the same set of priorities of routing direction for further processing at 514.

In some embodiments, the fan-out sequence estimation mechanism may identify the one or more other fan-out pins without performing any checks as that performed at 510. For example, the fan-out sequence estimation mechanism need not determine whether some potential routing of the one or more fan-out pins may conflict with these one or more remaining fan-out pins. In these embodiments, even more clock cycles, processing time, and IOs may be saved because the computing system on which the fan-out sequence estimation mechanism resides need not perform additional computation to determine whether the one or more remaining fan-out pins may be in conflict with some potential routing.

Figure 5D:
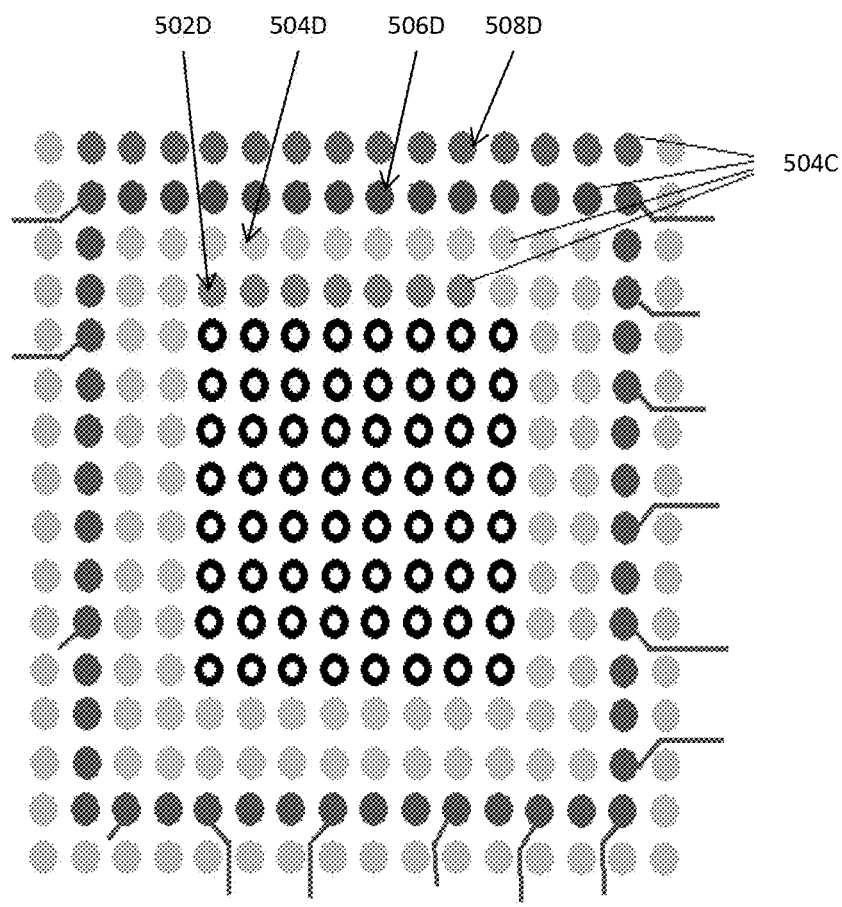
FIG. 5D illustrates an example of a modified sequence for fanning out pins of the integrated circuit design illustrated in FIG. 5B in one or more embodiments.

At 514, the fan-out sequence estimation mechanism may modify the default sequence for the fan-out pins that correspond to the one or more sets of priorities of routing direction identified at 506 as well as the one or more corresponding sets of priorities of routing direction for the one or more remaining fan-out pins identified at 512. Referring to FIG. 5D which illustrates an example of a modified sequence for fanning out pins of the integrated circuit design illustrated in FIG. 5B in one or more embodiments, the default fan-out sequence of fanning out outer fan-out pins before inner fan-out pins is modified.

In this example illustrated in FIG. 5D with the provided sets of priorities of routing directions, the fan-out sequence estimation mechanism may reverse the default fan-out sequence. More precisely, the default fan-out sequence provides that outer pins are fanned out before inner pins, and the modified fan-out sequence (due to the priorities of routing directions being DLRU) now provides that inner pins are fanned out before outer pins. Therefore the modified sequence for the four rows of fan-out pins 502D, 504D, 506D, and 508D is now 502D→504D→506D→508D, rather than 508D→506D→504D→502D as in the default fan-out sequence.

Figure 6:
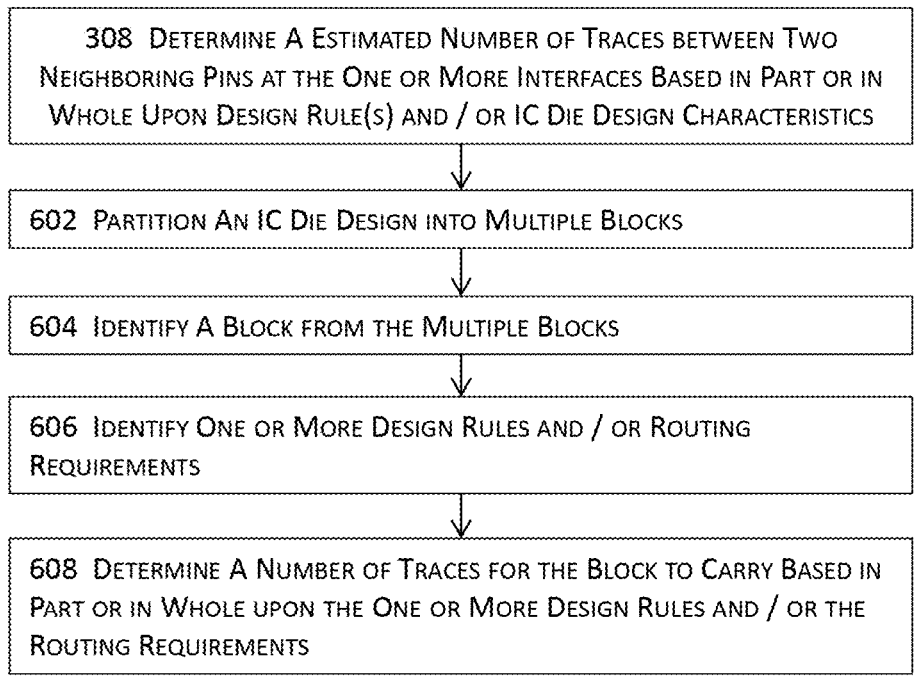
FIG. 6 illustrates a more detailed block diagram for a block illustrated in FIG. 3A for implementing an IC package layout design with an integrated circuit package design estimator in one or more embodiments.

FIG. 6 illustrates a more detailed block diagram for a block illustrated in FIG. 3A for implementing an IC package layout design with an integrated circuit package design estimator in one or more embodiments. More specifically, FIG. 6 illustrates more details about block 308 of FIG. 3A. In these one or more embodiments, a partition mechanism including or functioning in conjunction with at least one processor may invoke the processor to execute instructions to partition an IC die design into a plurality of blocks at 602. In one embodiment, a block includes a rectangular area where the four vertices of the rectangular are is located at four fan-out pins of the IC die design. A block may be considered as a trace carrier having routing capacity to accommodate zero or more traces in one or more embodiments.

The trace estimation mechanism may identify a block from the plurality of blocks at 604 and identify one or more design rules and/or routing requirements at 606. The one or more design rules may include, for example, one or more spacing rules between two immediately neighboring traces, one or more spacing rules between a trace and a pin or a die bump, design rules governing vias sizing, insertion, enclosure, and/or stacking, etc. The one or more routing requirements may include, for example, trace width(s), a total number of nets, etc. total area of the design space, the number of fan-out pins, etc. in some embodiments.

At 608, the trace estimation mechanism may then determine a number of traces that the block may carry or for which the block may have sufficient capacity based in part or in whole upon the one or more design rules and/or the one or more routing requirements. In some of these embodiments, the trace estimation mechanism may use the capacity of the block by using the lengths of the sides of the block as the capacity and then determine the number of traces that may pass through these sides.

Figure 7A:
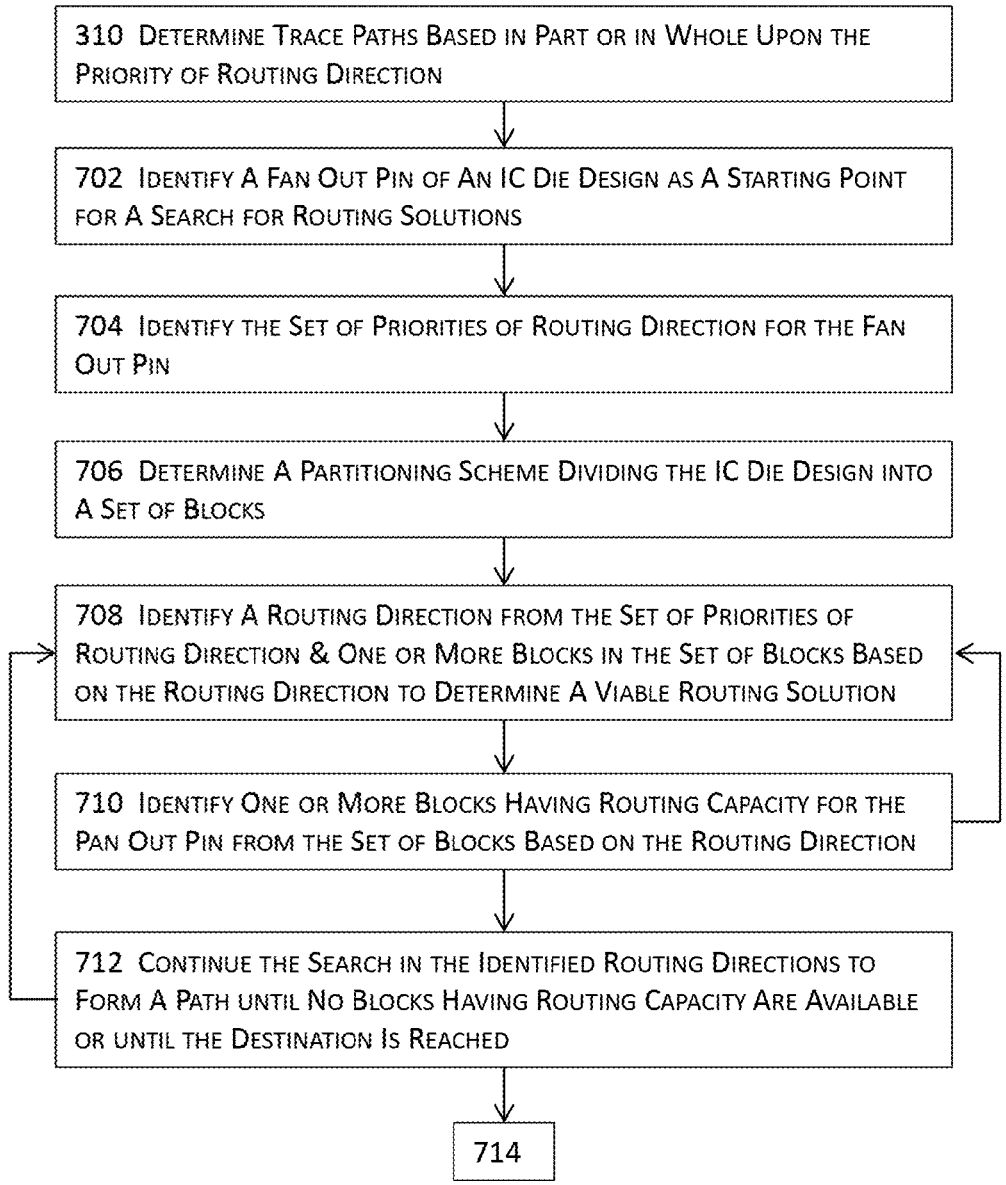
FIGS. 7A-B jointly illustrate a more detailed block diagram for a block illustrated in FIG. 3A for implementing an IC package layout design with an integrated circuit package design estimator in one or more embodiments.
Figure 7B:
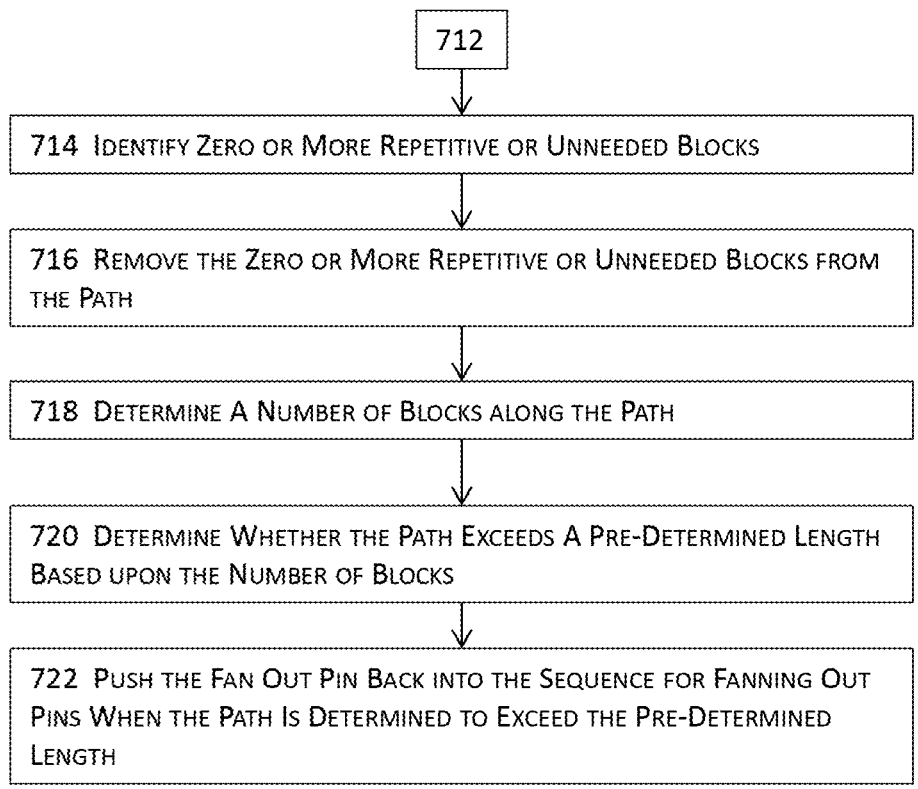

FIGS. 7A-B jointly illustrate a more detailed block diagram for a block illustrated in FIG. 3A for implementing an IC package layout design with an integrated circuit package design estimator in one or more embodiments. More specifically, FIGS. 7A-B jointly illustrate more details about block 310 of FIG. 3A. A trace path estimation mechanism (e.g., 130 of FIG. 1A) including or functioning in conjunction with at least one processor may identify a fan-out pin of an IC die design as a starting point for a search for viable routing solutions at 702. A viable routing solution may include a topological trace that generally indicates how a trace connects a source and a destination of the trace but does not necessarily include the geometric details (e.g., dimensions) of the trace in some embodiments.

In these embodiments, a trace in the viable routing solution may resemble a global route for IC designs. A viable routing solution may include a geometric trace that includes all the geometric details (e.g., dimensions) of the trace in some other embodiments. In these embodiments, a trace in the viable routing solution may resemble a detail route for IC designs. At 704, the trace path estimation mechanism may identify the set of priorities of routing direction for the fan-out pin by using the approaches such as those described for reference numeral 304 in FIG. 4A in one or more embodiments. The set of priorities of routing direction may be used to guide the trace path estimation mechanism in one or more directions to search for viable routing solutions.

At 706, the trace path estimation mechanism may invoke and function in conjunction with the partitioning mechanism (e.g., 140 of FIG. 1A) to determine a partitioning scheme that divides the IC die design including at least the fan-out pins into a set of blocks. In some embodiments, the partitioning mechanism may reference the partition scheme to divide the IC die design into a set of rectangular blocks, each of which having four vertices corresponding to four fan-out pins of the IC die design. In some of these embodiments, the vertices of a rectangular block correspond to four pairs of immediately neighboring fan-out pins of the IC die design.

At 708, the trace path estimation mechanism may identify a routing direction with the set of priorities of routing directions and a block from the set of blocks identified at 706. For example, given a set of priorities of ULRD (upward direction first, then leftward direction, then rightward direction, and downward direction last), the trace path estimation mechanism may first search in the upward direction starting at the fan-out pin to determine whether a viable trace segment may be determined or whether the design space may accommodate a trace segment starting from the fan-out pin and continuing along the upward direction. If such a viable routing solution cannot be determined, the trace path estimation mechanism may identify the another routing direction (e.g., the routing direction having the next highest priority) at 708, the leftward direction in the above example, and determine whether the search in this routing direction leads to the identification of a block having sufficient capacity to accommodate a trace segment starting at the fan-out pin and continuing along this routing direction.

The trace path estimation mechanism may repeat the search until a routing direction results in a viable routing solution or until all routing directions have been exhausted yet a viable routing solution cannot be determined. In the former case, the trace path may proceed to 710 to determine whether one or more blocks having sufficient capacity to accommodate at least a portion of the trace can be determined along the identified routing direction. If the trace path estimation mechanism cannot identify any block having sufficient capacity to accommodate at least a portion of the trace toward its destination, the trace path estimation mechanism may return to 708 to identify another routing direction according to the set of priorities of routing directions (e.g., the routing direction having the next highest priority).

If one or more blocks having sufficient capacity to continue the trace toward its destination along the identified routing direction, the trace path estimation mechanism may continue the search to form at least a portion of the trace until either no blocks having sufficient capacity can be found along the identified routing direction or until the destination has been reached at 712. If the destination has not been reached, but no further blocks may be found to form a viable solution, the trace path estimation mechanism may return to 708 to identify another routing direction (e.g., the routing direction having the next highest priority). If all routing directions according to the set of priorities of routing direction have been exhausted, but the destination is not yet reached, the trace path estimation mechanism may push the fan-out pin back into the fan-out sequence.

In some embodiments, the trace path estimation mechanism may push the fan-out pin identified at 702 to the bottom of the sequence. The trace path estimation mechanism may also function in conjunction with the layer and stack-up estimation mechanism (e.g., 102 of FIG. 1A) to increase the number of layers because the current layer cannot provide sufficient space to accommodate a trace from the identified fan-out pin to its destination. At 714, the trace path estimation mechanism may identify any repetitive or unneeded blocks (e.g., blocks that cause unnecessary bends in the viable routing solution, etc.) These repetitive or unneeded blocks may be optionally removed at 716 by the trace path estimation mechanism.

By eliminating these repetitive or unneeded blocks, the underlying computing systems performing various tasks need much fewer clock cycles and less processor utilization and thus do not have to perform as much computation to route the IC package layout design. In addition, the underlying computing system or the processor thus needs fewer network round-trips via network elements and/or fewer IO (input/output) requests for accessing design data via various bus architectures (e.g., a system bus in a processor or external bus in a computing system to access peripherals)

while routing the IC package layout design because of fewer blocks and hence less space to search for traces or interconnects.

The trace path estimation mechanism may determine a number of blocks along the trace path at 718 and optionally determine whether the trace path exceeds a predetermined length threshold based in part or in whole upon the number of blocks at 720. In some embodiments where the IC die design and at least a portion of the IC package layout design are partitioned into a plurality of uniform or non-uniform blocks, the predetermined length threshold of a trace path may be determined to be the maximum or multiples of the maximum of the number of columns and the number of rows from a source fan-out pin to a destination in the partitioned design space. In one of these embodiments, the length threshold may be determined to be the one-and-one-half times (1.5) of the maximum of the number of rows and the number of columns between a source fan-out pin and its destination. That is, the predetermined length threshold may be determined by the following formula:

Predetermined Length Threshold of Trace=1.5× Maximum[number of rows, number of columns]

At 722, the trace path estimation mechanism may push the fan-out pin identified at 702 back into the fan-out sequence when the trace path is determined to exceed the predetermined length threshold. In one embodiment, the identified fan-out pin may be pushed to the bottom of the fan-out sequence. In another embodiment, the fan-out pin identified at 702 may be re-allocated to another existing layer, and if no other existing layers may accommodate this fan-out pin, the trace path estimation mechanism may send a request or message to the layer number and stack-up estimation mechanism to increase the number of layers for the IC package layout design.

In some of the embodiments illustrated in FIGS. 7A-B, the trace path estimation mechanism may collect all the fan-out pins that cannot be successfully fanned out to their respective destinations and try to fan out one or more of these fan-out pins in one or more other layers. In some other embodiments, the trace path estimation mechanism may collect these fan-out pins that cannot be successfully fanned out to their respective destinations, increase the total number of layers, and attempt to fan out these pins in a new layer. In addition or in the alternative, incrementing the total number of layers and creating a new layer may depend upon the total number of fan-out pins that cannot be successfully fanned out in their respective original layers.

Figure 8A:
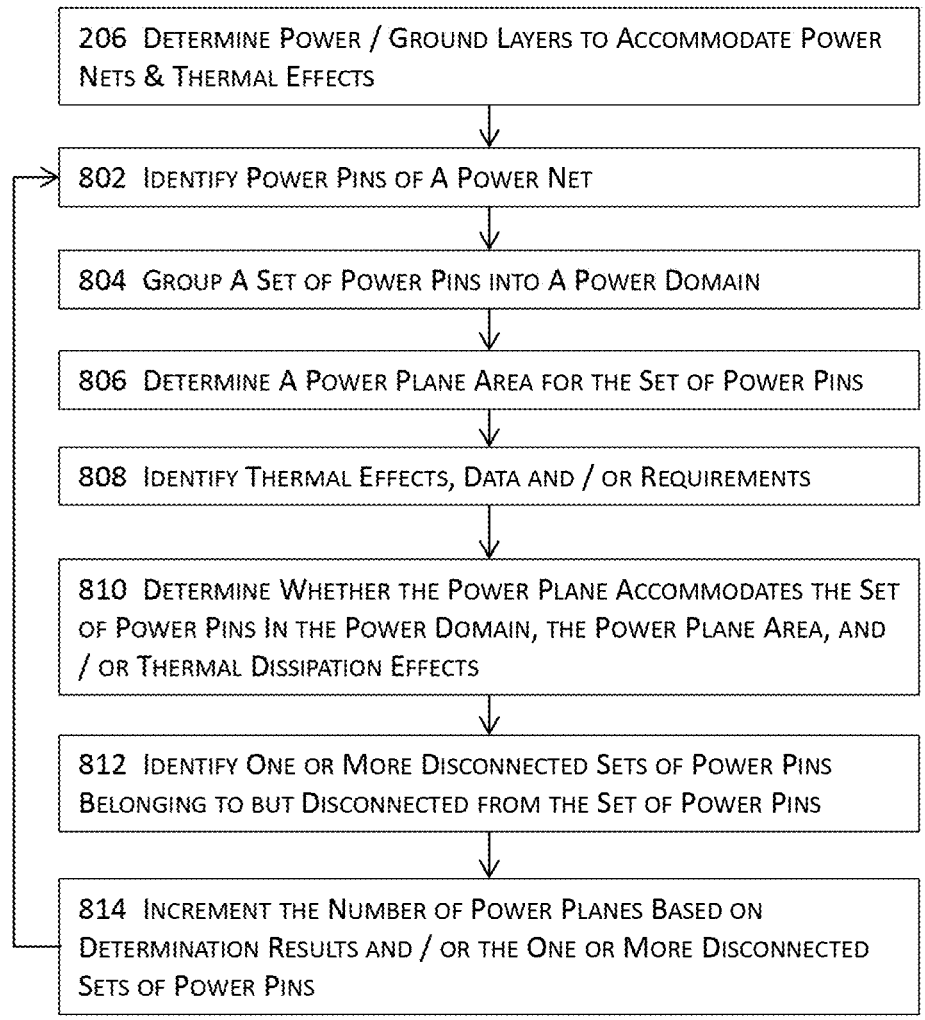
FIG. 8A illustrates a more detailed block diagram for a block illustrated in FIG. 2 for implementing an IC package layout design with an integrated circuit package design estimator in one or more embodiments.

FIG. 8A illustrates a more detailed block diagram for a block illustrated in FIG. 2 for implementing an IC package layout design with an integrated circuit package design estimator in one or more embodiments. More specifically, FIG. 8A illustrates more details about block 206 of FIG. 2. In one or more embodiments illustrated in FIG. 2, the power and ground plane estimation mechanism (e.g., 104 of FIG. 1A) may identify the power pins of a power net at 802 and group a set of these identified power pins into a power domain at 804. For example, the power and ground plane estimation mechanism may reference the connectivity information for the IC package layout design fabric to identify one or more power nets and then their respective power pins at 802.

The power pins in a set of power pins belonging to the same power domain may not be randomly grouped together. Rather, a group of power pins that are grouped into a power domain at 804 are also connected. Therefore, in grouping a set of identified power pins, the power and ground plane estimation mechanism may, for example, reference the results generated by the trace path estimation mechanism to identify the power pins that may be interconnected and then group these power pins into a group in a power domain at 804. The power and ground plane estimation mechanism may determine whether the power plane includes a sufficient size to accommodate the power plane areas for the set of power pins or for all the power pins. As described above, power planes and ground planes may be used for controlling impedance, providing reference planes, and/or enhancing heat dissipation of the IC package layout design.

A power plane may provide a short close loop path for electrical currents and may act as a reference for one or more signals in the IC package layout design in one or more embodiments. A ground plane may be inserted to reduce EMC (electromagnetic coupling) emissions and may also act as a reference for one or more signals in one or more embodiments. The power and ground plane estimation mechanism may thus determine whether the power plane has sufficient area to provide power plan areas to adequately dissipate heat for the power pins at 806. At 808, thermal effects, data, and/or requirements may be identified.

For example, heat generation by IC dies may be identified from actual thermal measurements with contact type measurements (e.g., measurements with thermocouples) or non-contact type measurements (e.g., with infra thermal measurement tools). Heat generation by IC dies or discrete components in the IC package layout design fabric may also be identified from thermal analyses or simulations. Various data (e.g., thermal budget, thermal conductivity, specific heat, temperature distributions, characteristics of active or passive cooling systems, etc.) related to thermal behavior of the IC package layout design may also be identified at 808. In addition or in the alternative, requirements including, for example, maximum permissible operating temperature, etc. may be identified at 808.

At 810, the power and ground plane estimation mechanism may determine whether the power plane accommodates the set of power pins in the power domain and grouped at 804, the power plane area for the power pins, and/or the thermal effects, data, and/or requirements. The power and ground plane estimation mechanism may further determine whether all of the power pins belonging to the power plane have been grouped into the set of power pins and identify any power pins, if any, in the same power domain at 812.

If the power and ground plane estimation mechanism determines that at least one power pin in the same power domain is not and cannot (e.g., cannot be interconnected with the power pins that have been grouped into the set) be grouped into the set of power pins in the power domain, the power and ground plane estimation mechanism further attempt to group these disconnected power pins into one or more disconnected sets of power pins in the same power domain at 812. Given the presence of one or more disconnected sets of power pins in the power domain as those power pins in the set determined at 806, the power and ground plane estimation mechanism may increment the number of power planes and create a new power plane at 814. The power and ground plane estimation mechanism may then return to 802 to identify the power pins for another power domain and repeat the processes of 802 through 814 until all power pins in the IC package layout design have been processed.

Figure 8B:
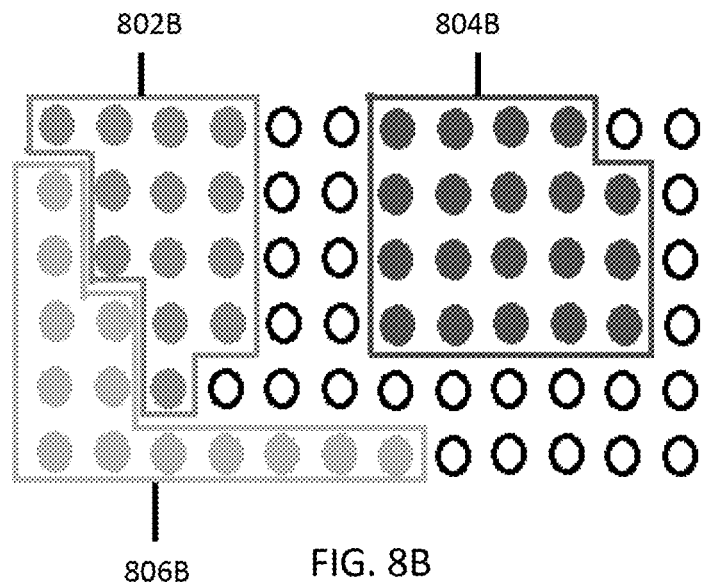
FIG. 8B illustrates an example of grouping fan out pins of an integrated circuit design into three power domains that may be accommodated with one power plane in one or more embodiments.

FIG. 8B illustrates an example of grouping fan out pins of an integrated circuit design into three power domains that may be accommodated with one power plane in one or more embodiments. More specifically, FIG. 8B illustrates an example of an IC package layout design including the fan-out pins some of which are power pins. In this example illustrated in FIG. 8B, the IC package layout design include three power domains, and all the power pins can be grouped into three different sets 802B, 804B, and 806B, each of which corresponds to one of the three power domains. In this example illustrated in FIG. 8B, the IC package layout design includes no disconnected sets of power pins because all power pins are properly grouped into their respective groups.

Figure 8C:
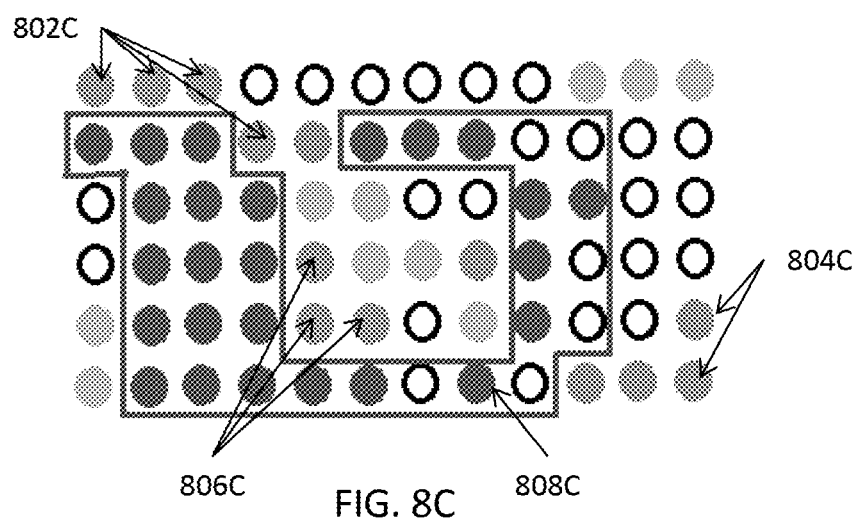
FIG. 8C illustrates another example an integrated circuit design whose fan out pins may not be grouped into a number of power domains that can be accommodated with a single power plane in one or more embodiments.

FIG. 8C illustrates another example an integrated circuit design whose fan out pins may not be grouped into a number of power domains that can be accommodated with a single power plane in one or more embodiments. In this example illustrated in FIG. 8C, power pins 808C for a first power domain are grouped into a set. Nonetheless, power pins for a second power domain 802C, 804C, and 806C cannot be grouped into one set while these power pins are interconnected. Rather, these power pins in the second power domain may not be properly interconnected because of their locations in the design. In this example, the power and ground plane estimation mechanism may thus increment the total number of power planes and create one or more power planes to accommodate at least one set of the disconnected sets of power pins 802C, 804C, and 806C in the second power domain.

Figure 8D:
FIG. 8D illustrates an example of a layer stack estimated and produced by an IC package layout design estimator in one or more embodiments.

FIG. 8D illustrates an example of a layer stack-up estimated and produced by an IC package layout design estimator in one or more embodiments. More specifically, FIG. 8D illustrates a schematic, graphical representation of a six-layer stack-up that is estimated by the layer and stack-up estimation mechanism. The layer and stack-up estimation mechanism may also provide some hint or description for some or all of the layers in the stack-up, and how one layer is located relative to one or more other layers. In this example illustrated in FIG. 8D, layer 1 includes the signal routing and ground structures; layer 2 includes the power layer; layer 3 includes the signal routing and power structures; layer 4 includes the power layer; layer 5 includes the signal routing and power structures; and layer 6 includes the ground layer.

Figure 8E:
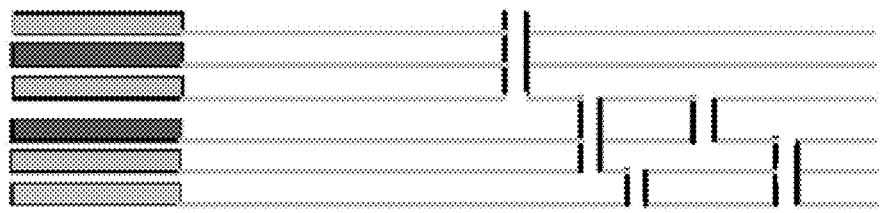
FIG. 8E illustrates a graphic example of a via structure estimated and produced by an IC package layout design estimator in one or more embodiments.

FIG. 8E illustrates a graphic example of a simplified via structure estimated and produced by an IC package layout design estimator in one or more embodiments. More specifically, the simplified via structure illustrated in FIG. 8E includes the via structure and visual representations of these via structures with their respective layering information. The via structures may be stored in a via library so the via structures may be used in an electronic design without the designers generating or devising these structures. The via structure may be graphically represented alongside the layer stack-up in some embodiments so designers may visualize these via structures with reference to the layer stack-up.

Figure 8F:
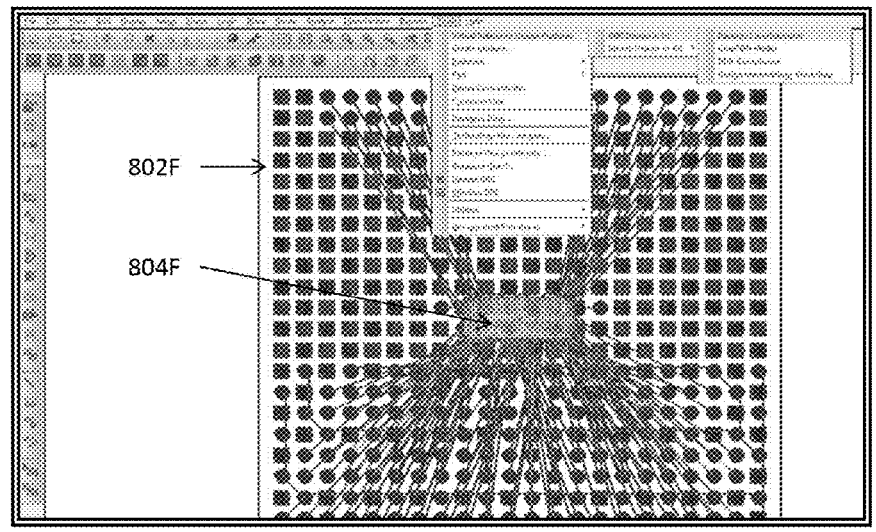
FIG. 8F illustrates an example of a user interface of an IC package layout design estimator in one or more embodiments.

FIG. 8F illustrates an example of a user interface of an IC package layout design estimator in one or more embodiments. More specifically, FIG. 8F illustrates a user interface showing an IC die design 804F having a plurality of pins fanned out to corresponding destination connections (e.g., die bumps) of an IC package layout design 802F.

Figure 8G:
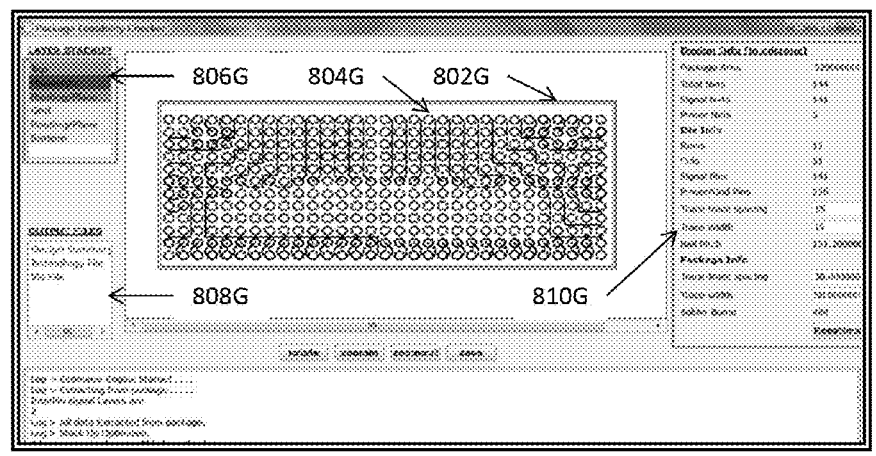
FIG. 8G illustrates an example of a user interface of an IC package layout design estimator showing information about the layer stack-up, design information, output files, and a design window in one or more embodiments.

FIG. 8G illustrates an example of a user interface of an IC package layout design estimator showing information about the layer stack-up, design information, output files, and a design window in one or more embodiments. FIG. 8G illustrates the fan-out pins 804G of an IC die design 802G with some traces that connect some of the fan-out pins. FIG. 8G also shows a graphic illustration of layer-stack-up 806G with description of each layer, some output files 808G each of which may be further displayed by, for example, clicking on the name of the file, and a design information summary window 810G including various pieces of information including, for example, the package area, the total number of nets, the total number of signal nets, the total number of power nets, a layout of IC die fan-out pins (e.g., the number of rows, the number of columns, spacing value(s), the number of power/ground pins, the ball pitch(es), etc. for the IC die design and the IC package layout design, the solder bump characteristics, etc.

Figures 1, 8H:
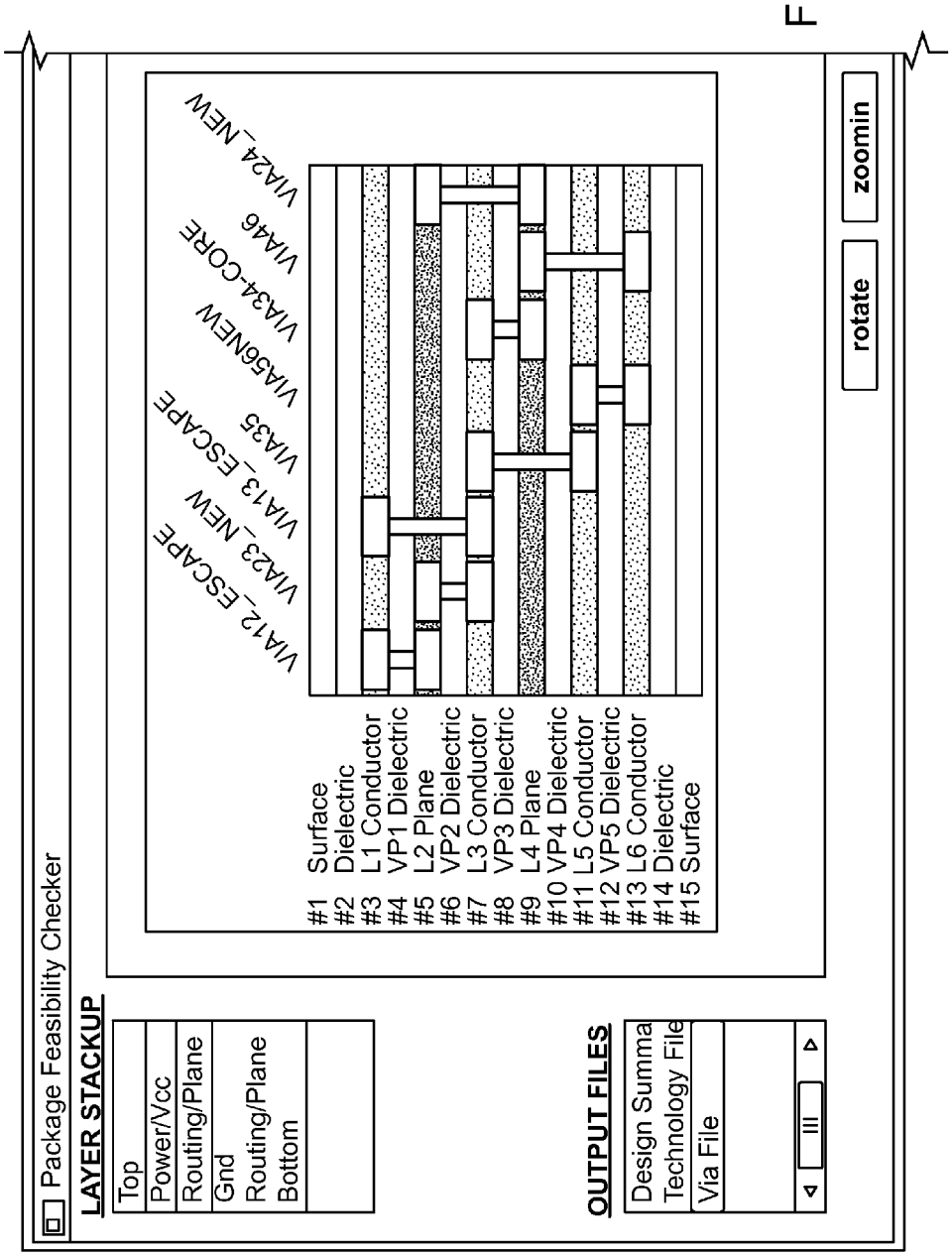

FIGS. 8H-1 and 8H-2 jointly illustrate an example of a via library generated by an IC package layout design estimator in one or more embodiments. More specifically, FIGS. 8H-1 and 8H-2 jointly show that a via library may include, for example, the via structure for each via, graphical representations of vias with respect to layer stack-up, textual description of the start layer and the end layer for each via, and/or a brief description of each via, etc. During design implementation, a designer may simply reference a via in the via library and add the via to the design, and the EDA tool will perform the remaining tasks, without designers having to device the structures, description, etc. for the via.

Figure 8I:
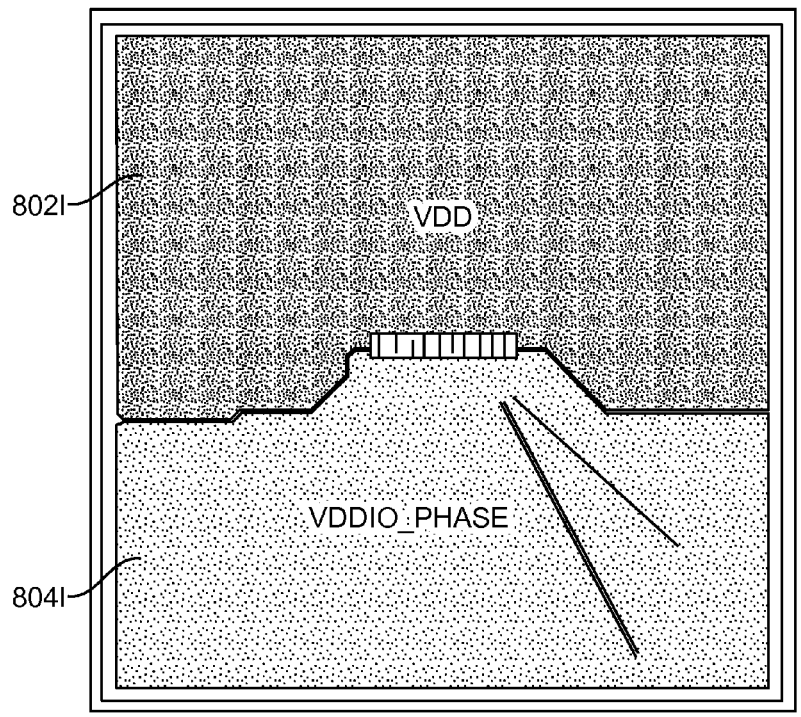
FIG. 8I an example of an implemented IC package estimator output including a power plane in a metal layer of an IC package layout design in one or more embodiments.
Figure 8J:
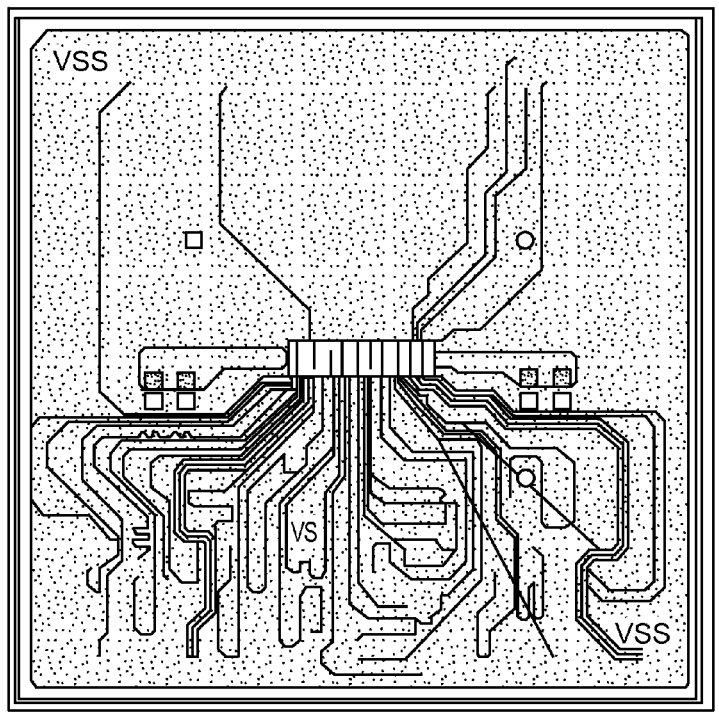
FIG. 8J an example of an implemented IC package estimator output including some routed traces and a ground plane in a metal layer of an IC package layout design in one or more embodiments.

FIG. 8I an example of an implemented IC package estimator output including a power plane in a metal layer of an IC package layout design in one or more embodiments. More specifically, FIG. 8I illustrates power plane for the main positive power supply voltage ($V_{DD}$) power domain 802I in the upper portion of FIG. 8I and the peripheral voltages (VDDIO) power domain 804I for signals such as signals in the memory bus, etc. in the lower portion of FIG. 8I generated by the package layout estimator mechanism in one or more embodiments. FIG. 8J an example of an implemented IC package estimator output including some routed traces and a ground plane in a metal layer of an IC package layout design in one or more embodiments. More specifically, FIG. 8J illustrates a ground plane for the negative power supply voltage ($V_{SS}$) with trace paths in another metal layer generated by the package layout estimator mechanism in one or more embodiments.

SYSTEM ARCHITECTURE OVERVIEW

Figure 9:
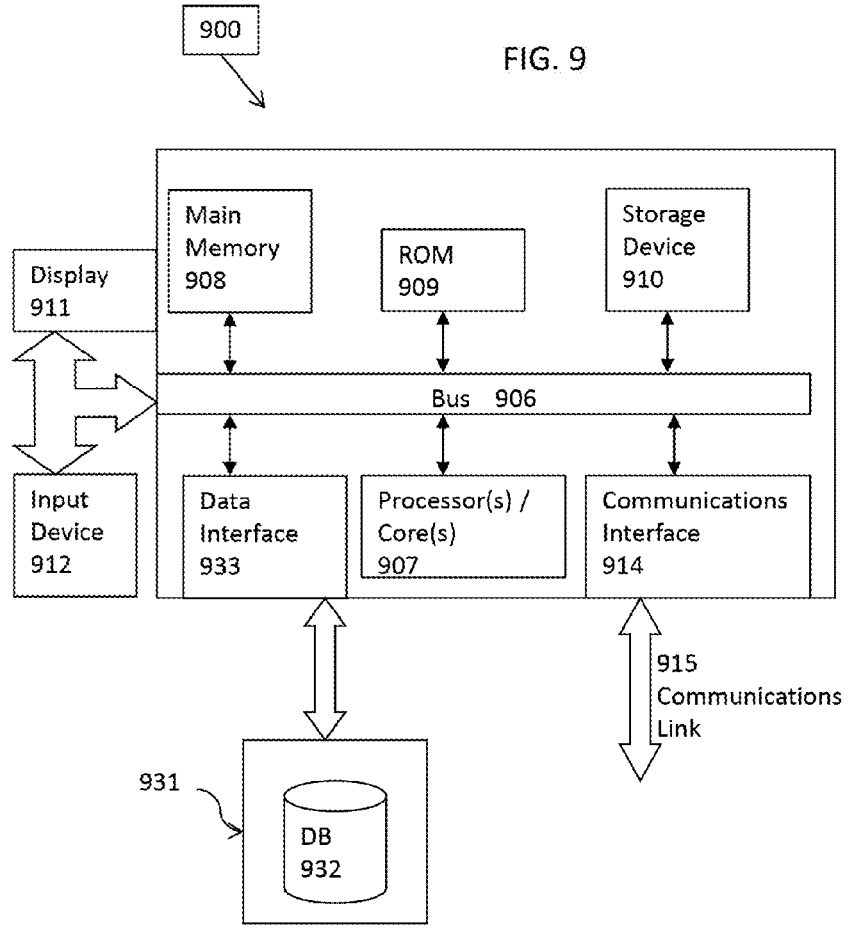
FIG. 9 illustrates a computerized system on which a method for performing channel analyses for an communication interface of an electronic system and a method for implementing an IC package layout design with an integrated circuit package design estimator may be implemented.

FIG. 9 illustrates a block diagram of an illustrative computing system 900 suitable for implementing an IC package layout design with an integrated circuit package design estimator as described in the preceding paragraphs with reference to various figures. Computer system 900 includes a bus 906 or other communication mechanism for communicating information, which interconnects subsystems and devices, such as processor 907, system memory 908 (e.g., RAM), static storage device 909 (e.g., ROM), disk drive 910 (e.g., magnetic or optical), communication interface 914 (e.g., modem or Ethernet card), display 911 (e.g., CRT or LCD), input device 912 (e.g., keyboard), and cursor control (not shown).

According to one embodiment, computer system 900 performs specific operations by one or more processor or processor cores 907 executing one or more sequences of one or more instructions contained in system memory 908. Such instructions may be read into system memory 908 from another computer readable/usable storage medium, such as static storage device 909 or disk drive 910. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 907, where the one or more processors, one or more processor cores, or combination thereof executes one or more threads. For example, the act of determining one or more estimated numbers of layers, the act of determining whether the power and/or ground layers accommodate power nets and/or thermal effects, the act of generating technology files, routing schemes, and/or via libraries, determining one or more fan-out sequences, the act of determining priorities of routing directions, the act of determining trace paths, the act of adjusting an estimated number of layers, etc. may be performed by one or more processors, one or more processor cores, or combination thereof. A mechanisms described herein may also be implemented as a pure hardware module (e.g., a block of electronic circuit components) or a combination of a hardware module and a software block that jointly perform various tasks to achieve various functions or purposes described herein or equivalents thereof. For example, a mechanism described herein may be implemented as an application-specific integrated circuit (ASIC) in some embodiments. A mechanism described herein or an equivalent thereof may perform its respective functions alone or in conjunction with one or more other mechanisms. A mechanism described herein or an equivalent thereof may thus invoke one or more other mechanisms by, for example, issuing one or more commands or function calls. The invocation of one or more other mechanisms may be fully automated or may involve one or more user inputs.

The term "computer readable storage medium" or "computer usable storage medium" as used herein refers to any medium that participates in providing instructions to processor 907 for execution. Such a medium may take many forms, including but not limited to, non-volatile media and volatile media. Non-volatile media includes, for example, optical or magnetic disks, such as disk drive 910. Volatile media includes dynamic memory, such as system memory 908. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 900. According to other embodiments of the invention, two or more computer systems 900 coupled by communication link 915 (e.g., LAN, PTSN, or wireless network) may perform the sequence of instructions required to practice the invention in coordination with one another.

Computer system 900 may transmit and receive messages, data, and instructions, including program, i.e., application code, through communication link 915 and communication interface 914. Received program code may be executed by processor 907 as it is received, and/or stored in disk drive 910, or other non-volatile storage for later execution. In an embodiment, the computer system 900 operates in conjunction with a data storage system 931, e.g., a data storage system 931 that includes a database 932 that is readily accessible by the computer system 900. The computer system 900 communicates with the data storage system 931 through a data interface 933. A data interface 933, which is coupled to the bus 906, transmits and receives electrical, electromagnetic or optical signals that include data streams representing various types of signal information, e.g., instructions, messages and data. In embodiments of the invention, the functions of the data interface 933 may be performed by the communication interface 914.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing an IC package design with an integrated circuit package design estimator, comprising:
   determining an estimated number of layers for an integrated circuit (IC) package design that includes one or more IC die designs with a layer and stack-up estimation mechanism comprising at least one processor that identifies the IC package design and determines the estimated number of layers for the IC package design;
   determining whether the estimated number of layers suffice to accommodate routing demands for interconnections between the IC package design and the one or more IC die designs with the layer and stack-up estimation mechanism;
   determining a power layer or a ground layer based in part or in whole upon one or more factors with a power and ground plane estimation mechanism; and
   generating an output for the IC package design with a guideline and scheme generation mechanism that functions in conjunction with the at least one processor that generates the output with at least the estimated number of layers and the power layer or the ground layer.

2. The computer implemented method of claim 1, wherein the layer and stack-up estimation mechanism that determines the estimated number of layers further performs acts comprising:
   determining an estimated number of layers for the IC package design;
   identifying one or more fan-out inputs; and
   invoking a prioritization mechanism to determine a set of priorities of routing direction for a fan-out pin of a plurality of fan-out pins of an IC die design of the one or more IC die designs in the IC package design.

3. The computer implemented method of claim 2, wherein the one or more fan-out inputs include a netlist of the IC package design, geometric information of the IC package design, placement data for at least one of the one or more IC die designs, or information about power supplies to the IC package design.

4. The computer implemented method of claim 2, wherein the layer and stack-up estimation mechanism that determines the estimated number of layers further performs the acts comprising:
   determining a set of characteristics upon which the estimated number of layers depends;

determining a relation between the estimated number of layers and the set of characteristics; and determining the estimated number of layers for the IC package design using the relation.

5. The computer implemented method of claim 2, wherein the layer and stack-up estimation mechanism that determines the estimated number of layers further performs the acts comprising:

invoking a fan-out sequence estimation mechanism to determine a fan-out sequence for fanning out the plurality of fan-out pins;

invoking a trace estimation mechanism or a trace path estimation mechanism to determine an estimated number of traces between two fan-out pins based in part or in whole upon one or more criteria; and determining a plurality of trace paths based in part or in whole upon the set of priorities with the trace path estimation mechanism or the trace estimation mechanism.

6. The computer implemented method of claim 5, wherein the one or more criteria comprise one or more design rules and/or one or more characteristics of the IC die design, and the one or more characteristics include a total number of nets.

7. The computer implemented method of claim 5, wherein the layer and stack-up estimation mechanism that determines the estimated number of layers further performs the acts comprising:

incrementing or decrementing the estimated number of layers for the IC package design.

8. The computer implemented method of claim 2, wherein the prioritization mechanism that determines the set of priorities of routing direction further performs the acts comprising:

identifying the fan-out pin from the plurality of fan-out pins of the IC die design;

partitioning the IC die design into a plurality of partitions; and identifying a position of the fan-out pin in the IC die design.

9. The computer implemented method of claim 8, wherein the prioritization mechanism that determines the set of priorities of routing direction further performs the acts comprising:

identifying a destination for the fan-out pin; and determining or updating the set of priorities of routing direction using the destination as a guide.

10. The computer implemented method of claim 5, wherein the fan-out sequence estimation mechanism that determines the fan-out sequence further performs the acts comprising:

identifying one or more fan-out pins of the plurality of fan-out pins;

identifying a default sequence for fanning out the IC die design;

identifying one or more sets of priorities of routing direction for the one or more fan-out pins; and identifying one or more corresponding destinations for the one or more fan-out pins.

11. The computer implemented method of claim 10, wherein the fan-out sequence estimation mechanism that determines the fan-out sequence further performs the acts comprising:

determining whether potential routing for the one or more fan-out pins conflicts with one or more remaining fan-out pins of the IC die design;

identifying one or more other fan-out pins exhibiting similar priorities as the one or more fan-out pins and one or more corresponding sets of priorities of routing direction for the one or more remaining fan-out pins; and modifying the default sequence for at least some of the plurality of fan-out pins that correspond to the one or more sets of priorities and the one or more corresponding sets of priorities.

12. The computer implemented method of claim 5, wherein the trace estimation mechanism or the trace path estimation mechanism that determines the estimated number of traces further performs the acts comprising:

invoking a partitioning mechanism to partition the IC design into multiple blocks;

identifying a block from the multiple blocks;

identifying one or more design rules and/or routing requirements; and determining the estimated number of traces based in part or in whole upon the one or more design rules and/or the routing requirements with the trace estimation mechanism.

13. The computer implemented method of claim 5, wherein the trace path estimation mechanism or the trace path estimation mechanism that determines the plurality of trace paths further performs the acts comprising:

identifying the fan-out pin of the IC die design as a starting point for a search for viable routing solutions;

identifying the set of priorities of routing direction for the fan-out pin; and determining a partitioning scheme dividing the IC die design into a set of blocks.

14. The computer implemented method of claim 13, wherein the trace path estimation mechanism or the trace path estimation mechanism that determines the plurality of trace paths further performs the acts comprising:

identifying a routing direction from the set of priorities of routing direction and one or more blocks from the set of blocks based in part or in whole upon the routing direction;

identifying one or more blocks having routing capacity for the pan-out pin from the set of blocks based in part upon the routing direction; and forming a path by continuing the search in the routing direction until a stopping criterion is reached.

15. The computer implemented method of claim 13, wherein the trace path estimation mechanism or the trace path estimation mechanism that determines the plurality of trace paths further performs the acts comprising:

identifying one or more repetitive or unneeded blocks;

removing the one or more repetitive or unneeded blocks;

determining a total number of blocks along the path; and determining whether or not the fan-out pin is pushed back into the fan-out sequence based in part upon the total number of blocks.

16. The computer implemented method of claim 1, wherein the power and ground plane estimation mechanism that determines the power layer and/or the ground layer further performs the acts comprising:

identifying power pins of a power net in the IC package design;

grouping at least some of the power pins into a first grouping in a power domain;

identifying thermal effects, data, and/or requirements; and determining a number of power planes based in part or in whole upon the thermal effects, data, and/or requirements and results of grouping at least some of the power pins.

17. A system for implementing an IC package design with an integrated circuit package design estimator, comprising:
one or more mechanisms at least one of which comprises at least one processor or a processor core that executes one or more threads in a computing system;
non-transitory computer accessible storage medium holding program code that includes a sequence of instructions that, when executed by the at least one processor or processor core, cause the at least one processor or processor core to at least determine an estimated number of layers for an integrated circuit (IC) package design that includes one or more IC die designs, determine whether the estimated number of layers suffice to accommodate routing demands for interconnections between the IC package design and the one or more IC die designs, determine a power layer or a ground layer based in part or in whole upon one or more factors, and generate an output for the IC package design based using at least the estimated number of layers and the power layer or the ground layer.

18. The system of claim 11, wherein the non-transitory memory holds the program code, and the program code includes further instructions that, when executed by the at least one processor or processor core, cause the at least one processor or processor core to determine an estimated number of layers for the IC package design, identify one or more fan-out inputs, and determine a set of priorities of routing direction for a fan-out pin of a plurality of fan-out pins of an IC die design of the one or more IC die designs in the IC package design.

19. An article of manufacture comprising a non-transitory computer accessible storage medium having stored thereupon a sequence of instructions which, when executed by at least one processor or at least one processor core executing one or more threads, causes the at least one processor or the at least one processor core to perform a process for implementing an IC package design with an integrated circuit package design estimator, the process comprising:
determining an estimated number of layers for an integrated circuit (IC) package design that includes one or more IC die designs with a layer and stack-up estimation mechanism comprising at least one processor that identifies the IC package design and determines the estimated number of layers for the IC package design;
determining whether the estimated number of layers suffice to accommodate routing demands for interconnections between the IC package design and the one or more IC die designs with the layer and stack-up estimation mechanism;
determining a power layer or a ground layer based in part or in whole upon one or more factors with a power and ground plane estimation mechanism; and
generating an output for the IC package design with a guideline and scheme generation mechanism that functions in conjunction with the at least one processor that generates the output with at least the estimated number of layers and the power layer or the ground layer.

20. The computer implemented method of claim 19, the process further comprising:
determining an estimated number of layers for the IC package design;
identifying one or more fan-out inputs; and
determining a set of priorities of routing direction for a fan-out pin of a plurality of fan-out pins of an IC die design of the one or more IC die designs in the IC package design.

* * * * *